US009830976B1

(12) United States Patent
Lee et al.

(10) Patent No.: US 9,830,976 B1
(45) Date of Patent: Nov. 28, 2017

(54) SYSTEMS AND METHODS FOR A HIGH PERFORMANCE MEMORY CELL STRUCTURE

(71) Applicant: Marvell International Ltd., Hamilton (BM)

(72) Inventors: Peter Lee, Pleasanton, CA (US); Winston Lee, Palo Alto, CA (US)

(73) Assignee: Marvell International Ltd., Hamilton (BM)

(*) Notice: Subject to any disclaimer, the term of this patent is extended or adjusted under 35 U.S.C. 154(b) by 0 days.

(21) Appl. No.: 15/144,480

(22) Filed: May 2, 2016

Related U.S. Application Data

(60) Provisional application No. 62/174,141, filed on Jun. 11, 2015, provisional application No. 62/156,085, filed on May 1, 2015.

(51) Int. Cl.
*G11C 7/10* (2006.01)
*G11C 11/419* (2006.01)
*G11C 7/22* (2006.01)

(52) U.S. Cl.
CPC ......... *G11C 11/419* (2013.01); *G11C 7/1051* (2013.01); *G11C 7/1078* (2013.01); *G11C 7/22* (2013.01)

(58) Field of Classification Search
CPC ........ G11C 7/1051; G11C 7/1078; G11C 7/22
USPC .................. 365/189.05, 230.05, 230.08
See application file for complete search history.

(56) References Cited

U.S. PATENT DOCUMENTS

| 6,078,544 | A | * | 6/2000 | Park | ......................... G11C 8/16 365/154 |
| 2006/0227595 | A1 | * | 10/2006 | Chuang | ................. G11C 11/412 365/154 |
| 2007/0279966 | A1 | * | 12/2007 | Houston | ............... G11C 11/412 365/154 |

* cited by examiner

*Primary Examiner* — Jason Lappas

(57) ABSTRACT

Systems and methods described herein provide a memory cell circuit. The memory cell circuit includes a first internal node communicatively coupled to a first write bit line via a first write pass gate, and a second internal node communicatively coupled to a second write bit line via a second write pass gate. The memory cell circuit further includes a first read bit line connected to a first read pass gate and a first transistor, and a second read bit line connected to a second read pass gate and a second transistor. The first internal node is decoupled from the first read bit line by the first transistor, and the second internal node is decoupled from the second read bit line by the second transistor when a write operation and a read operation occur at the same time.

20 Claims, 23 Drawing Sheets

SYSTEMS AND METHODS FOR A HIGH PERFORMANCE MEMORY CELL STRUCTURE

CROSS-REFERENCE TO RELATED APPLICATIONS

This disclosure claims the benefit of U.S. Provisional Patent Application No. 62/156,085, filed May 1, 2015, and U.S. Provisional Patent Application No. 62/174,141, filed Jun. 11, 2015. The aforementioned applications are hereby incorporated by reference herein in their entirety.

FIELD OF USE

This disclosure relates to a high performance 1-read/1-write (2-port) memory cell structure.

BACKGROUND OF THE DISCLOSURE

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the present disclosure.

Data memory elements such as static random-access memory (SRAM) can use two types of 1-Read/1-Write memory bit cells. A first type of bit cells may focus on optimizing area, rather than performance, which may use an 8-transistor (8T) single-ended bit line read scheme. Another type may focus on performance at the cost of a larger area, which may use an 8T differential bit line read scheme with larger transistors. In advanced semiconductor process nodes, the performance-area trade-off may incur performance drawbacks that affect yield and reliability of the memory unit. Specifically, when a fin field effect transistor (Fin-Fet) is used, the allowed channel lengths and the channel widths may be constrained and may change in increments by the number of fins. Thus the performance-area trade-off can be significant.

For a 2-read/write or dual-port (SR2P) memory cell, each of the two ports may perform both a read operation and a write operation. However, a SR2P may be susceptible to interactions between the two ports, and write-induced-read failures, read-induced-write failures read-induced-read failures, and both-ports-ON-induced disturb failures.

For multi-port memory cells, maintaining a good write/read/stability margin can be difficult, which may result in larger size of individual transistors, a greater overall leakage power, and greater risk of port-to-port interaction related failures.

SUMMARY

Systems and methods described herein provide a memory cell circuit. The memory cell circuit includes a first internal node communicatively coupled to a first write bit line via a first write pass gate, and a second internal node communicatively coupled to a second write bit line via a second write pass gate. The memory cell circuit further includes a first read bit line connected to a first read pass gate and a first transistor, and a second read bit line connected to a second read pass gate and a second transistor. The first internal node is decoupled from the first read bit line by the first transistor, and the second internal node is decoupled from the second read bit line by the second transistor when a write operation and a read operation occur at the same time.

In some implementations, the memory cell circuit further includes a write word line that is configured to control the first write pass gate and the second write pass gate, and a read word line that is configured to control the first read pass gate and the second read pass gate.

In some implementations, the first write pass gate and the second write pass gate are turned on when a write operation occurs.

In some implementations, the first read pass gate and the second read pass gate are turned on when a read operation occurs.

In some implementations, the memory cell circuit further includes a first pull-down transistor connected to the first internal node; and a second pull-down transistor connected to the second internal node.

In some implementations, the first pull-down transistor is stronger than the first write pass gate, and the second pull-down transistor is stronger than the second write pass gate to achieve disturb stability.

In some implementations, the first write pass gate and the first read pass gate are separated to reduce fight between the first write pass gate and the first read pass gate.

In some implementations, the first read bit line is associated with a first port, and the second read bit line is associated with a second port; and the memory cell circuit has a dual-port structure with no port-to-port interaction.

In some implementations, the dual-port structure includes a differential read structure to achieve improved performance.

In some implementations, the memory cell circuit further includes a third port that has a third read bit line.

In some implementations, the memory cell circuit is applied in a product using a fin field effect transistor process without any write assist circuitry.

Systems and methods described herein further provide a method for reading or writing data to a memory cell circuit. The method includes performing a write operation by receiving data at a first internal node from a first write bit line via a first write pass gate, or at a second internal node from a second write bit line via a second write pass gate. The method further includes performing a read operation by reading previously stored data via a first read bit line connected to a first read pass gate and a first transistor, or via a second read bit line connected to a second read pass gate and a second transistor. The first internal node is decoupled from the first read bit line by the first transistor, and the second internal node is decoupled from the second read bit line by the second transistor when a write operation and a read operation occur at the same time.

BRIEF DESCRIPTION OF THE DRAWINGS

Further features of the disclosure, its nature and various advantages will become apparent upon consideration of the following detailed description, taken in conjunction with the accompanying drawings, in which like reference characters refer to like parts throughout, and in which.

DETAILED DESCRIPTION

This disclosure describes methods and systems for a 1-read/1-write high performance SRAM cell having a structure that is immune to read-write interactions that may diminish performance or cause intermittent, difficult-to-detect memory failures. The memory cell structure reduces port-to-port interactions such as read-to-write interactions, write-to-read interactions, read-to-read interactions, multiple-port-ON-disturb, such that the memory cell can be scaled to multi-port cells without sacrificing robustness of the cell.

Figure 1:
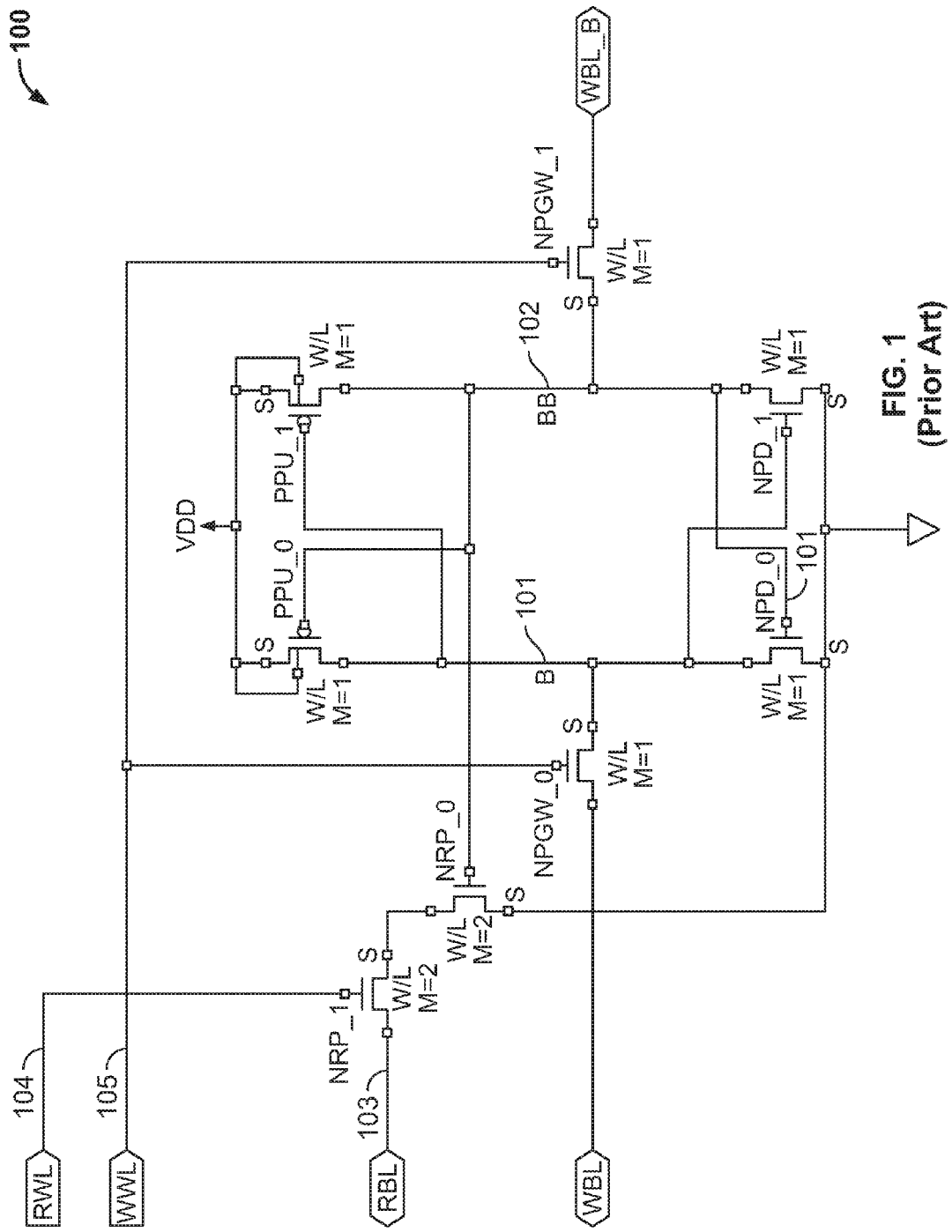
FIG. 1 provides an exemplary block diagram illustrating an 8T single-ended-read cell, which is immune to read-write interactions, with a smaller area but lower performance.

FIG. 1 provides an exemplary block diagram illustrating an 8T single-ended-read cell, which is immune to read-write interactions, with a smaller area but lower performance. The memory cell structure 100 is immune to read-write interactions because the two internal nodes of the cell, B 101 and BB 102 are de-coupled from read bit-line 103 (RBL). If a write operation and a read operation happen at the same time, both the read word-line 104 (RWL) and the write word-line 105 (WWL) will be ON. However, the internal node BB 102 may not see the RBL 103 node as they are isolated by the gate oxide of npd_0 transistor 107. Thus in this case, the memory cell 100 is not impacted by read-write interactions.

Figure 2:
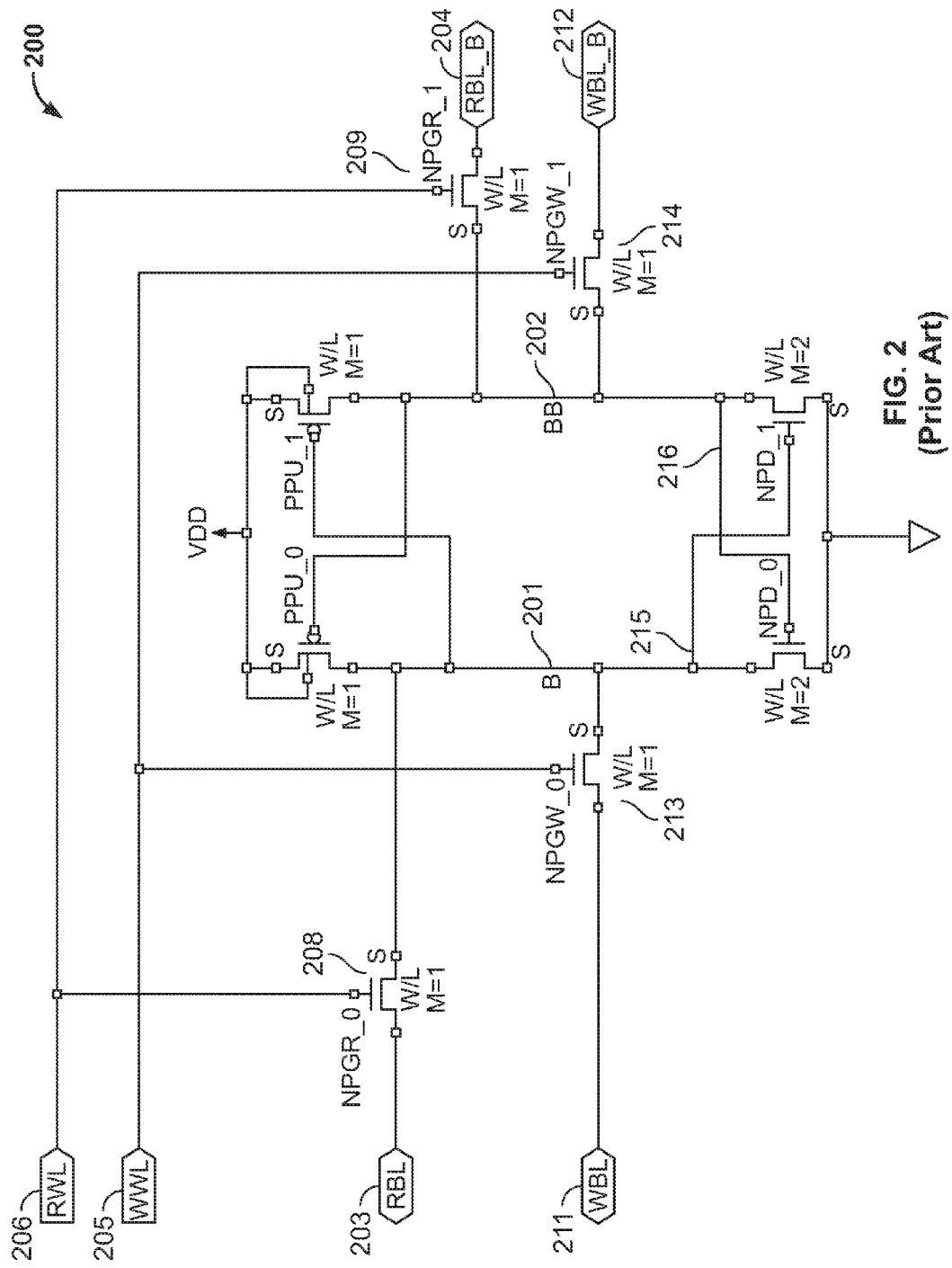
FIG. 2 provides an exemplary block diagram illustrating an 8T differential-read cell, which is high in performance but larger in area and susceptible to read-write interactions.

FIG. 2 provides an exemplary block diagram illustrating an 8T differential-read cell, which is high in performance but larger in area and susceptible to read-write interactions. The cell 200 is not immune to read-write interactions because the two internal nodes, B 201 and BB 202 are coupled to read bit-lines RBL 203 or RBL_B 204. When both WWL 205 and RWL 206 are ON at the same time, B 201 and BB 202 nodes may see RBL 203 or RBL_B 204 through the pass gates 208, 209 of read port. Therefore, the voltage and capacitance on RBL 203 or RBL_B 204 may affect the voltage on RBL 203 or RBL_B 204, and thus interfere with the operation happening in the write port 211-212. Therefore, the probability of success of a write operation can be negatively impacted by the any simultaneous read operation happening to the same row (e.g., word-line).

Similarly, a write operation may interfere with a read operation. When WWL 205 is ON while a read operation occurs, the low side of B 201/BB 201 node can be pulled up to higher voltage, causing the cell 200 to be weaker compared to the case when WWL 205 is OFF. Thus, the probability of success of a read operation can also be negatively impacted by any simultaneous write operation happening to the same row (e.g., word-line), but on a different column.

In addition to reducing success rates of a read or a write operation, the memory cell 200 may experience negative disturb when both WWL 205 and RWL 206 are ON at the same time. A disturb failure may happen when the cell content is corrupted with no explicit write command to the respective cell. Turning on a WL may potentially expose any SRAM cell to be corrupted. As a bit line (BL) can be normally pre-charged to the cell voltage $V_{DD}$, whenever WL turns ON, the B 201 or BB 202 node that is initially at a lower voltage can be pulled up to a high voltage. If the changed voltage at the B 201 or BB 202 node exceeds the trip point of the inverter which is part of the SRAM cell 200, then the cell content can be flipped, or corrupted, or disturbed. The probability of disturb may be greater for a cell that has multiple pass gates (e.g., 208. 209, 213 and 214, etc.) that can be turned ON at the same time, as shown in FIG. 2. This is because the two pass gates 208-209 can act together in parallel to double the effect of one pass gate, leading to a higher chance that the pull-down transistors 215-216 can be overpowered and thus the cell content may be flipped.

Figure 3:
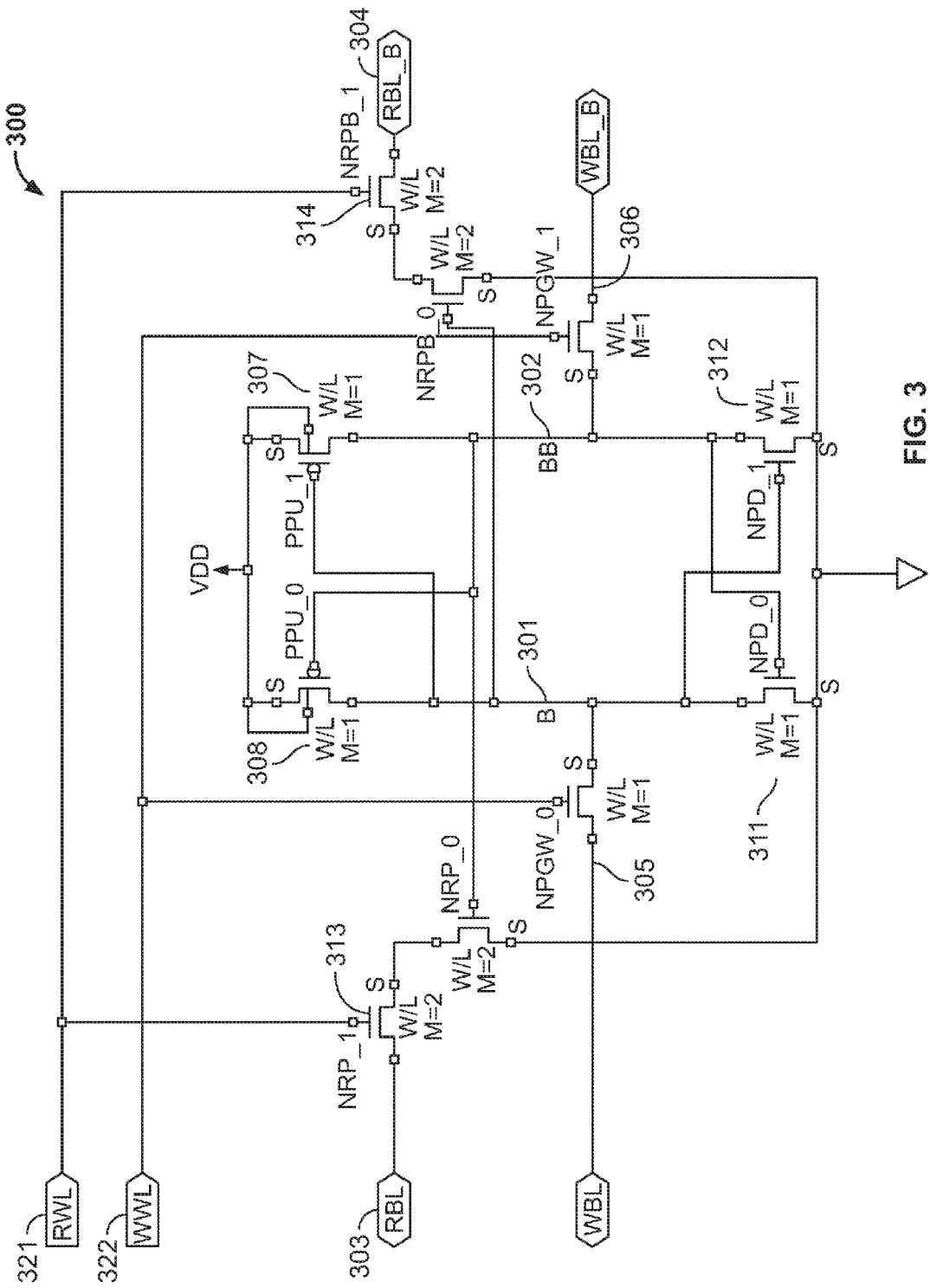
FIG. 3 provides an example block diagram illustrating a 10T differential-read cell that is both high in performance and immune to read-write interactions at the same or better area cost and performance as an 8T differential-read-cell as shown in FIG. 2, in accordance with various embodiments of the disclosure.

FIG. 3 provides an example block diagram illustrating a 10T differential-read cell that is both high in performance and immune to read-write interactions at the same or better area cost and performance as an 8T differential-read-cell as shown in FIG. 2, in accordance with various embodiments of the disclosure. The cell 300 may provide the immunity to read-write interactions, as well as reduced risk of disturb failure from the cell 100 in FIG. 1. For example, the nodes B 301 and BB 302 are decoupled from the RBL 303. Thus when a write operation and a read operation happen at the same time, e.g., both the RWL 321 and the WWL 322 are turned ON, BB 302 may not be affected by the RBL 303 node and B 301 may not be affected by the RBL_B 304 node.

In some implementations, the cell structure 300 may also reduce the risk of disturb. The risk of disturb can be proportional to the ratio of the effective pass gate strength to the effective pull down strength (e.g., the strength of the transistor can be defined to the normalized saturation drain current ($I_{dsat}$)). As shown in the memory cell 200 in FIG. 2, each pull-down NMOS 215 or 216 may fight against 2 pass gate NMOS 208 and 213, or 209 and 214, respectively. In 300, each pull-down NMOS 311 or 312 only fights against 1 pass gate NMOS 305 or 306. If the pass gate NMOS(es) 305 or 306 win against the pull-down NMOS 311 or 312, the cell state can be flipped (disturbed). However, the risk of disturb can be reduced in the cell structure 300 compared to the cell structure 200 in FIG. 2 because the worst-case pass gate strength is doubled in cell 200 as compared to that in cell 300.

The cell 300 can also provide a comparable high performance as that of the cell 200 in FIG. 2, with equivalent or less area as the cell 200 in FIG. 2. The size of the 10 transistors in the cell 300 can be adjusted such that the leakage power is comparable or better than the cell 200 in FIG. 2 while maintaining the same performance. The transistors can be further adjusted to improve performance even better at the cost of increased leakage power.

By eliminating read-write interaction and reducing the risk of disturb, the cell 300 may improve the yield, and also the reliability of the memory. When there are soft defects or greater-than-expected variation, or mismatch between the transistors within a cell, they can all behave in such a way that a simultaneous read/write to the same row (WL) may make the memory cell fail, e.g., as discussed in connection with FIG. 2. Screening out such defective cell may be challenging because testing all the cells on a circuit with a worst-case simultaneous read port and write port access may not be practical. For some memory units on the circuit, the worst-case simultaneous activity may occur when a read port clock is slightly earlier than the write port clock, or vice versa. The memory cell structure 300 in FIG. 3 may eliminate the need for such testing.

In further implementations, for Fin-Fet processes, sizing the individual transistors for a 2-port cell to obtain optimal read, write, or disturb margins may be more difficult compared to a non-Fin-Fet process, as the channel length of transistors in a Fin-Fet cell is fixed to one size. The effective channel width in a Fin-Fet cell may only change in multiples of an integral value, e.g., by the number of fins.

In some implementations, the strength of a P-type metal-oxide-semiconductor (PMOS) can be nearly equal to that of a N-type metal-oxide-semiconductor (NMOS) for a given fin number. Thus, to achieve a good write margin, a pass gate NMOS (e.g., 305, 306) may be sufficiently stronger than a pull-up PMOS (e.g., 307, 308), e.g., the $I_{dsat}$ of the pass gate NMOS is greater than the $I_{dsat}$ of the pull-up PMOS. On the other hand, to achieve a good disturb (stability) margin, the pull-down NMOS (e.g., 311, 312) may be sufficiently stronger than the pass gate (e.g., 305, 306), and the pull-up PMOS (e.g., 307, 308) to pull-down NMOS (e.g., 311, 312) ratio shall be maintained above certain threshold. Further, to provide a good read margin and performance, the combination of pass gates (e.g., 305, 306) and the pull-down NMOS (e.g., 311, 312) may be maintained to be sufficiently strong.

For a 2-port memory cell, the risk of disturb failure may be greater than that for a single port cell because two sets of pass gates may be turned ON at the same time if both read and write port WL's are ON at the same time. While it is possible to reduce the disturb risk by reducing the strength of each pass gate, this may not be practical in a Fin-Fet process, in which the channel length cannot be easily increased and the minimum channel width is at least one fin.

In addition, the risk of write failure may also be greater for a 2-port cell compared to a single port cell, especially in a Fin-Fet process. When the WLs of both ports are ON at the same time, the pass gate of the write port may fight against the pass gate of the read port, in addition to fighting against the pull-up of the cell. The pass gate of the read port, which is in a common-drain amplifier configuration, can be weakened by back-bias effect in a non-Fin-Fet process. But, due to reduced back-bias effect in Fin-Fet process, the pass gate of the read port may be relatively stronger, and thus writing is more difficult. In addition, as the PMOS strength being nearly equal to that of NMOS in a Fin-Fet process, the pass gate's fight against pull-up PMOS may be more difficult.

The 2-port cell 300 in FIG. 3 may help to eliminate the fight between pass gates 305, 306 of write port and the pass gates 313, 314 of read port during a write operation when both WLs are ON at the same time. Because of the additional difficulty for writing in a 2-port cell of a Fin-Fet process, sometimes additional write assist circuitry in the periphery may be used to assist the writing operation. The 2-port cell 300 in FIG. 3 may not need such additional write assist circuitry. The 2-port cell 300 may also avoid the doubled risk of disturb.

Thus, the memory cell 300 may improve not only yield, but reliability at the end-user application, and reduce the need for more stringent testing procedure. In addition, application of the cell 300 in circuits using Fin-Fet process may benefit from area reduction and performance increase because of reduced requirement for any write assist circuits, and reduced need for any read assist circuit to reduce disturb risk.

Figure 4:
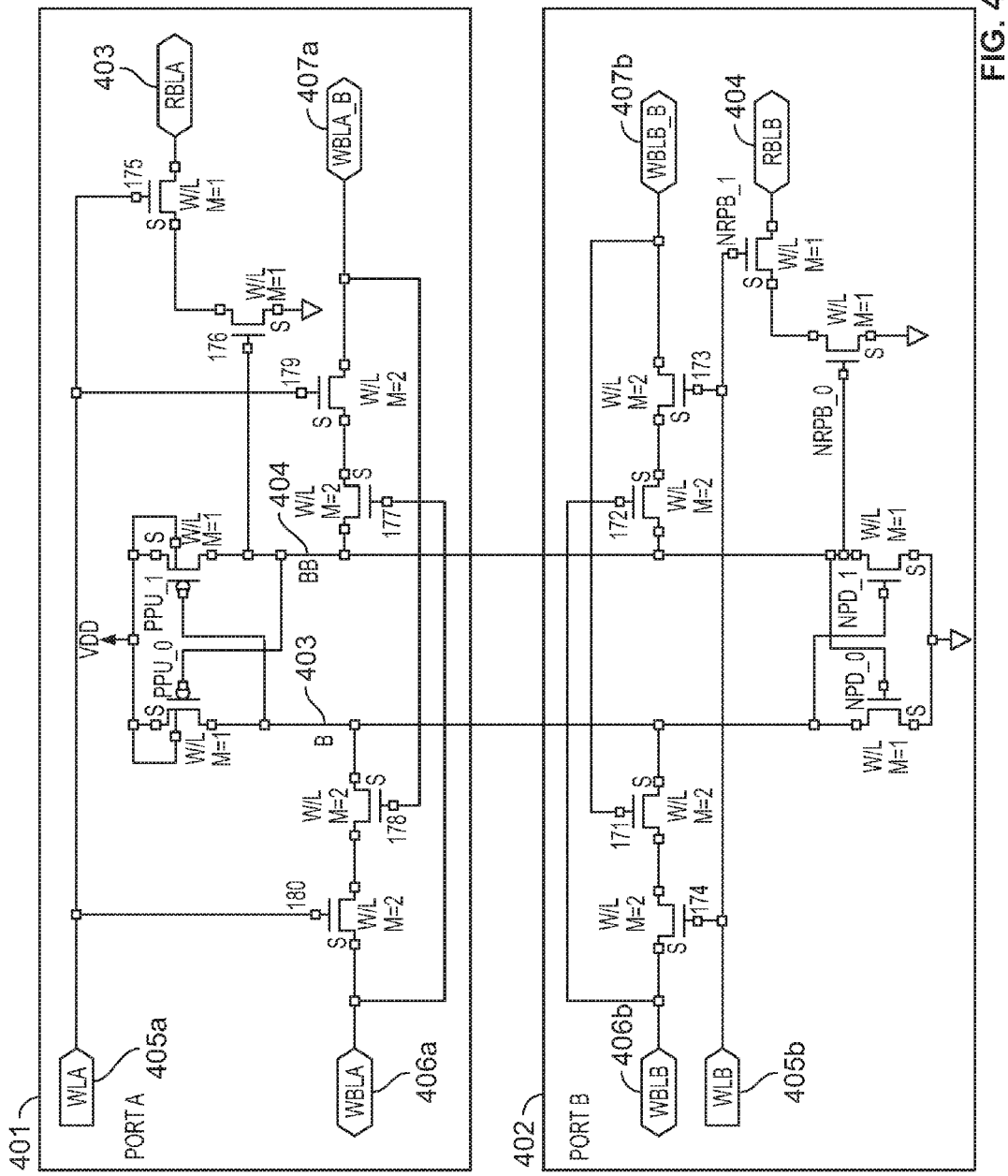
FIGS. 4-7 provide exemplary block diagrams illustrating alternative implementations of a dual-port cell based on the memory cell illustrated in FIG. 3, in accordance with various embodiments of the disclosure.

FIG. 4 provides exemplary block diagrams illustrating a 16T cell used for a 2-read/write (SR2P) cell without port to port interactions, in accordance with various embodiments of the disclosure. As shown in FIG. 4, the dual-port structure includes port A 401 and port B 402. The internal nodes B 403 and BB 404 are isolated from the read bit lines 403 or 404, respectively, and thus there is no port-to-port interactions, with a single-ended read. During a write operation, for unselected columns, both write bit line 406a or 406b and write bit line_bar 407a or 407b can be forced low. For selected column, one of the write bit lines 406a-b or 407a-b will be forced LOW while the other is forced high before the write word line turns ON.

Figure 5:
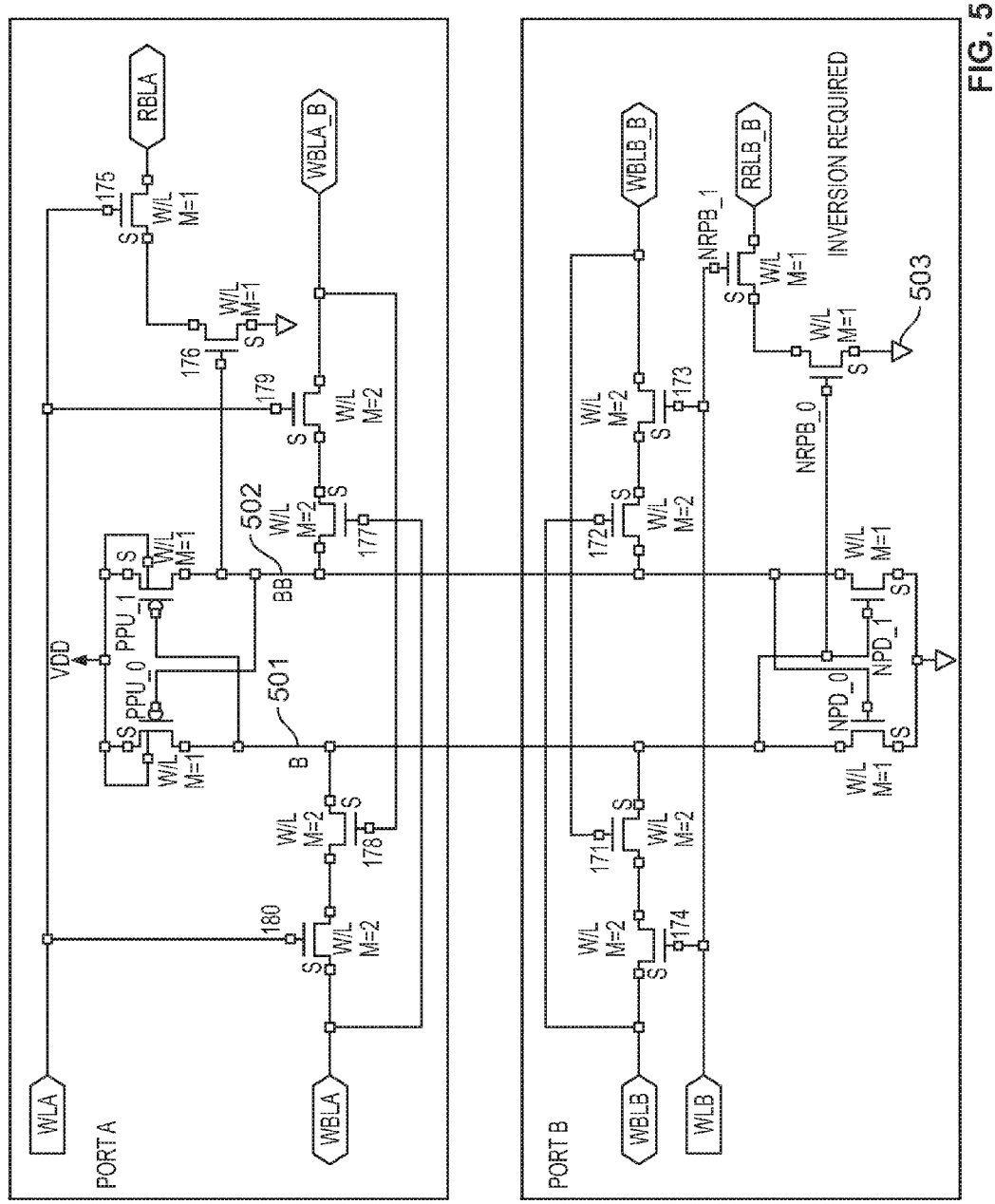

FIG. 5 provides an exemplary block diagram illustrating an alternative implementation of the 16T cell used for an SR2P cell illustrated in FIG. 4, in accordance with various embodiments of the disclosure. In FIG. 5, the internal nodes B 501 and BB 502 may have a balanced loading, but inversion may be required at the port B output 503.

Figure 6:
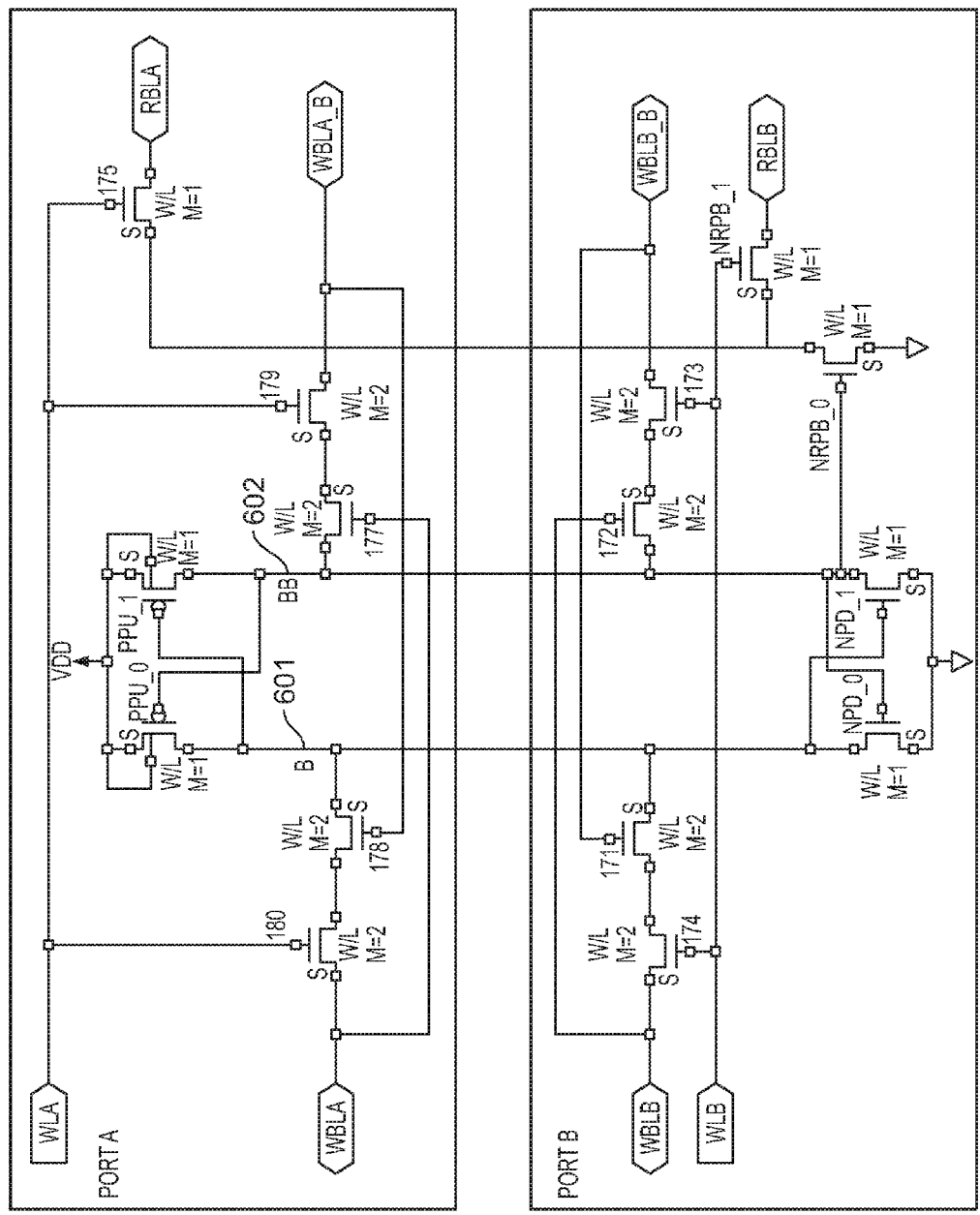

FIG. 6 provides an exemplary block diagram illustrating a 15T implementation of the 16T cell illustrated in FIG. 4, in accordance with various embodiments of the disclosure. Some port to port read-read interaction may be experienced.

Figure 7:
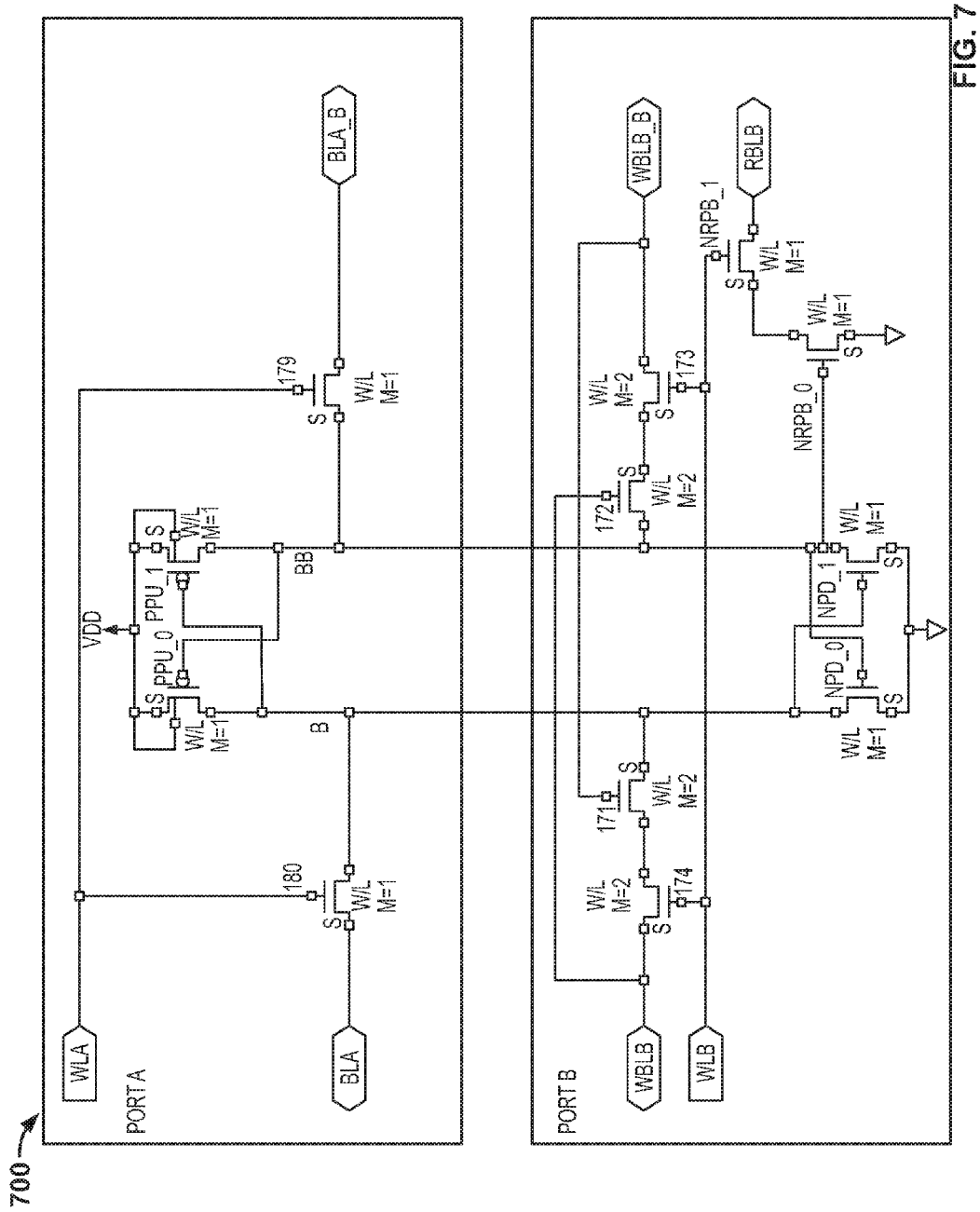

FIG. 7 provides an exemplary diagram illustrating a 12T implementation of the 16T cell illustrated in FIG. 4, in accordance with various embodiments of the disclosure. The cell structure 700 has less transistors. Interference from port B to port A can be reduced, as well as both port ON disturb. The cell 700 might be susceptible to single port disturb and interference from port A to port B.

Figure 8:
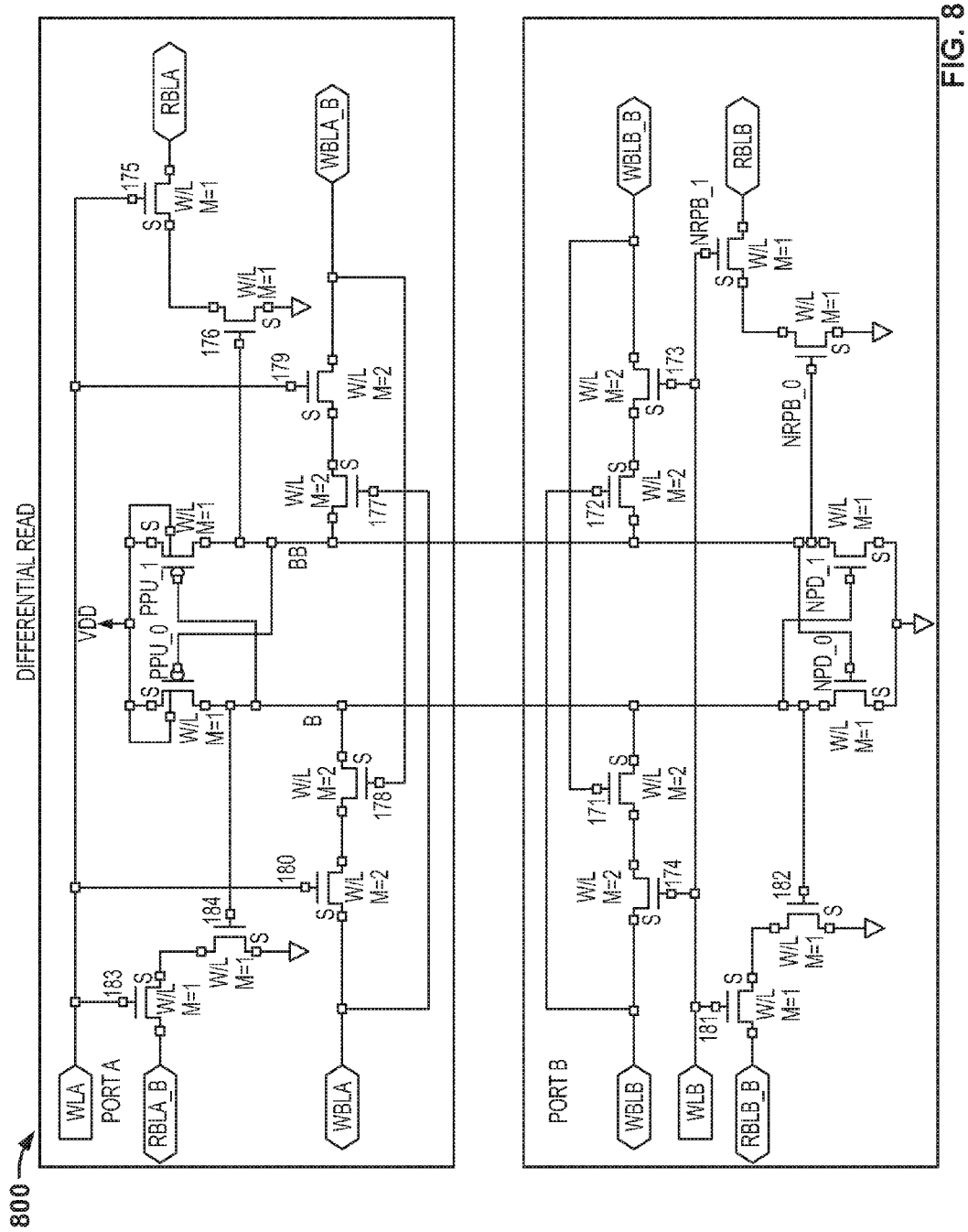
FIGS. 8-9 provide exemplary block diagrams illustrating alternative implementations of a dual-port cell with differential read for an SR2P cell illustrated in FIG. 4, in accordance with various embodiments of the disclosure.

FIG. 8 provides an exemplary block diagram illustrating a high performance implementation of FIG. 4, in accordance with various embodiments of the disclosure. The cell structure 800 is a 20T dual-port SRAM cell with no port to port interactions. Differential bit line sensing is used.

Figure 9:
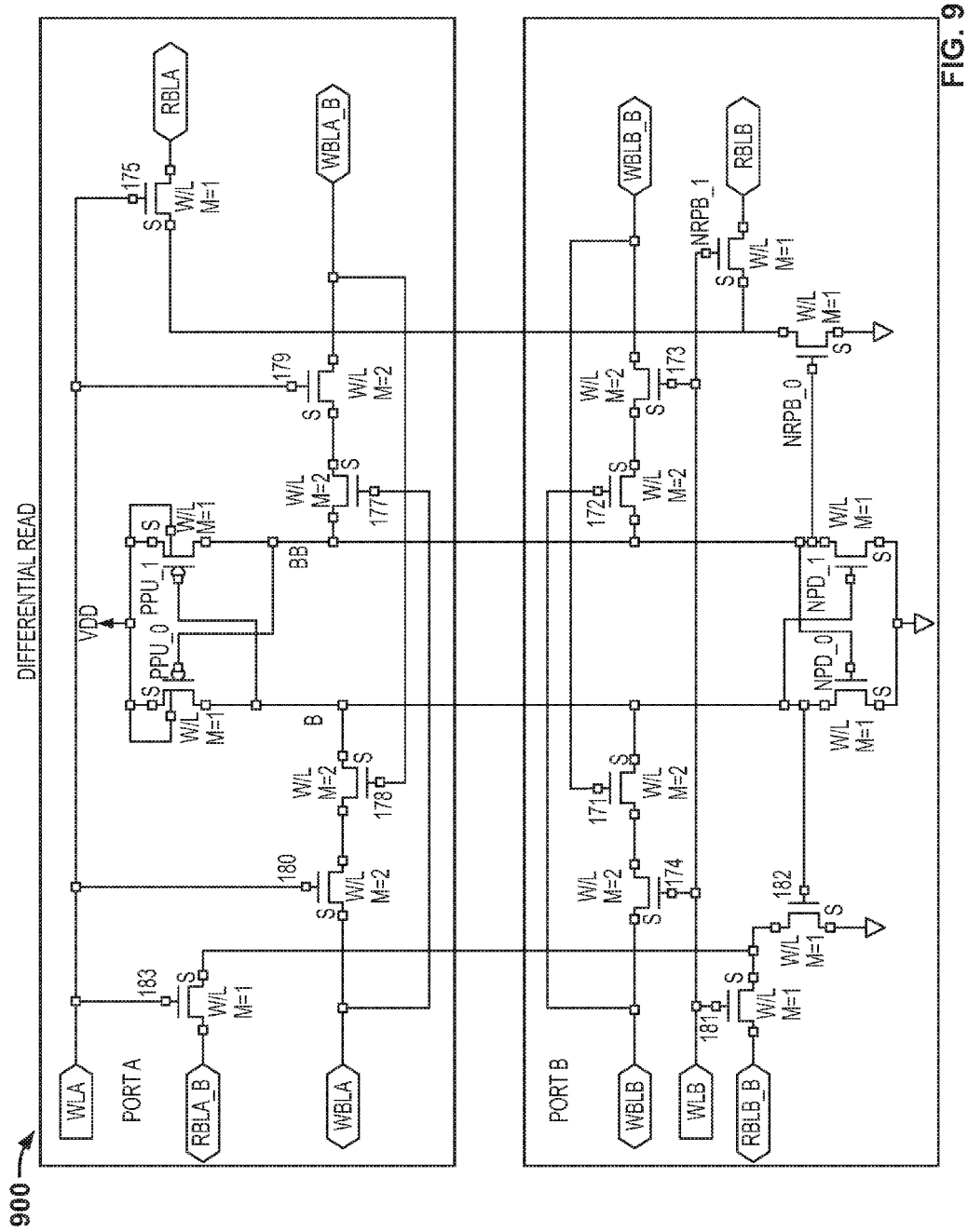

FIG. 9 provides an exemplary diagram illustrating an alternative implementation of the memory cell illustrated in FIG. 8, in accordance with various embodiments of the disclosure. The cell structure 900 is an 18T dual-port SRAM cell with no port to port interactions (may have a risk of read-read interaction), with differential read for high performance.

Figure 10:
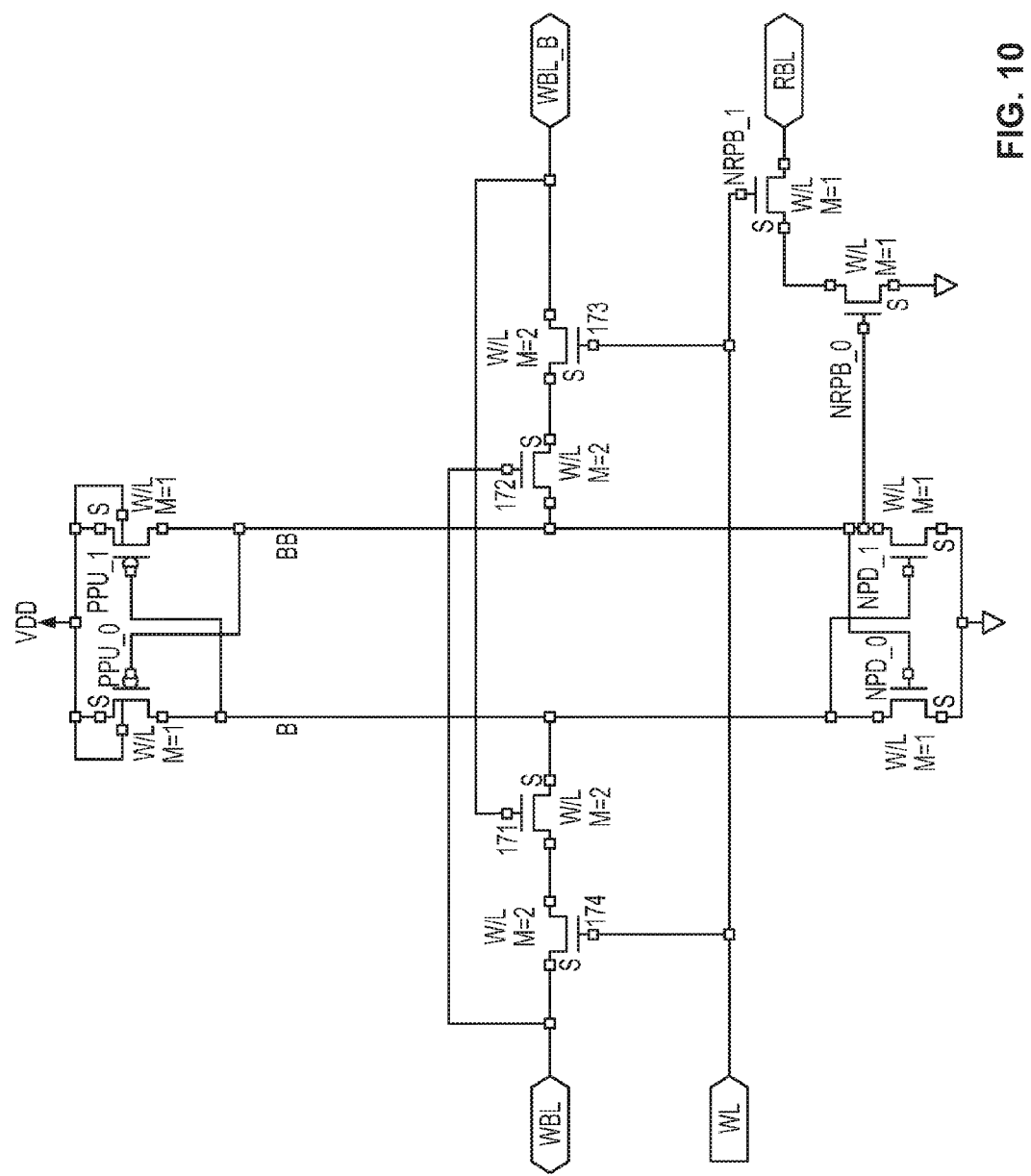
FIGS. 10-13 provide exemplary block diagrams illustrating alternative implementations of a disturb-proof memory cell structure, in accordance with various embodiments of the disclosure.

FIG. 10 provides an exemplary diagram illustrating a single port cell that is disturb-proof with only 1 WL, in accordance with various embodiments of the disclosure.

Figure 11:
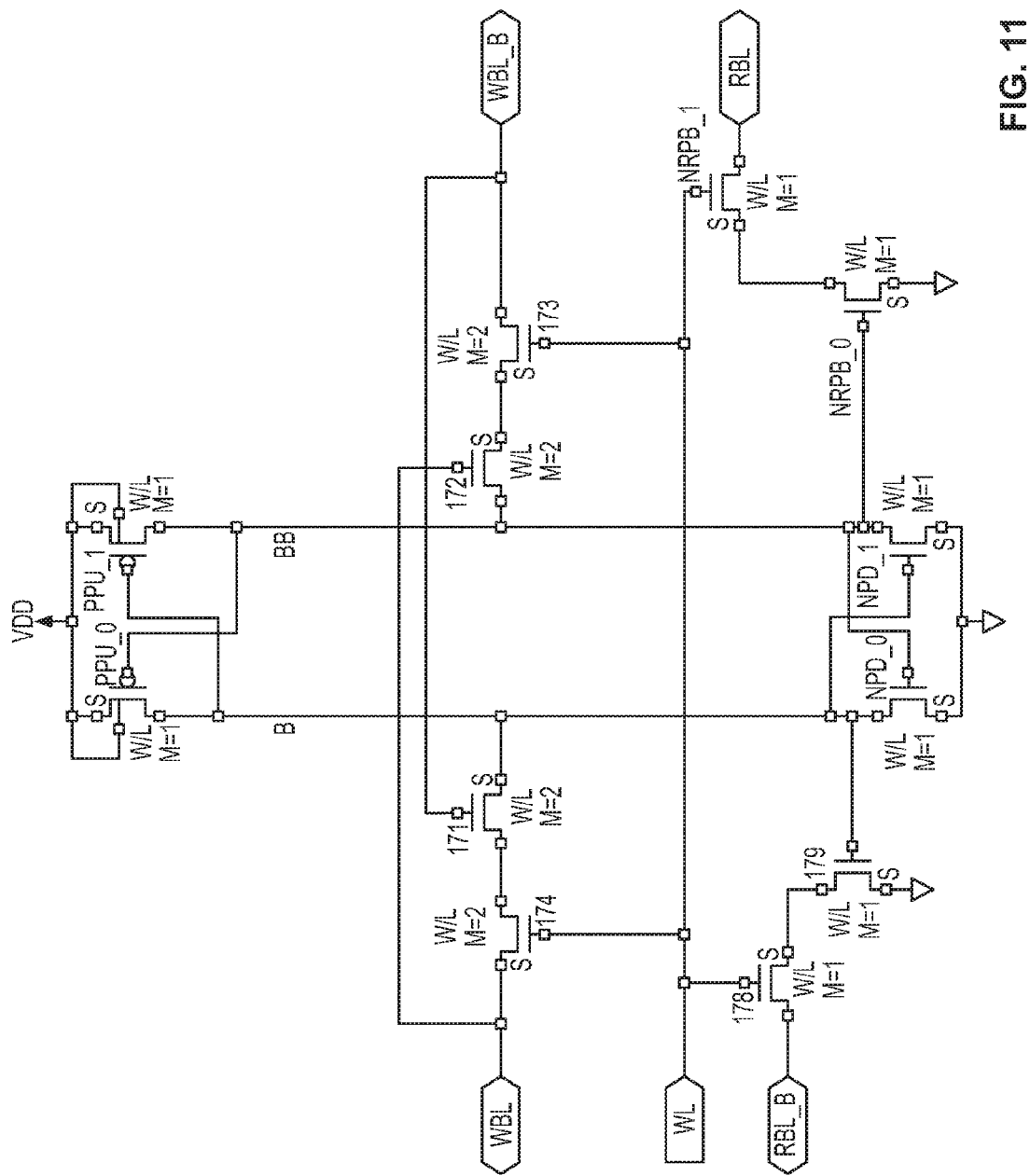

FIG. 11 provides an exemplary diagram illustrating a high performance version of the cell illustrated in FIG. 10, in accordance with various embodiments of the disclosure. For example, differential bit line sensing is used.

Figure 12:
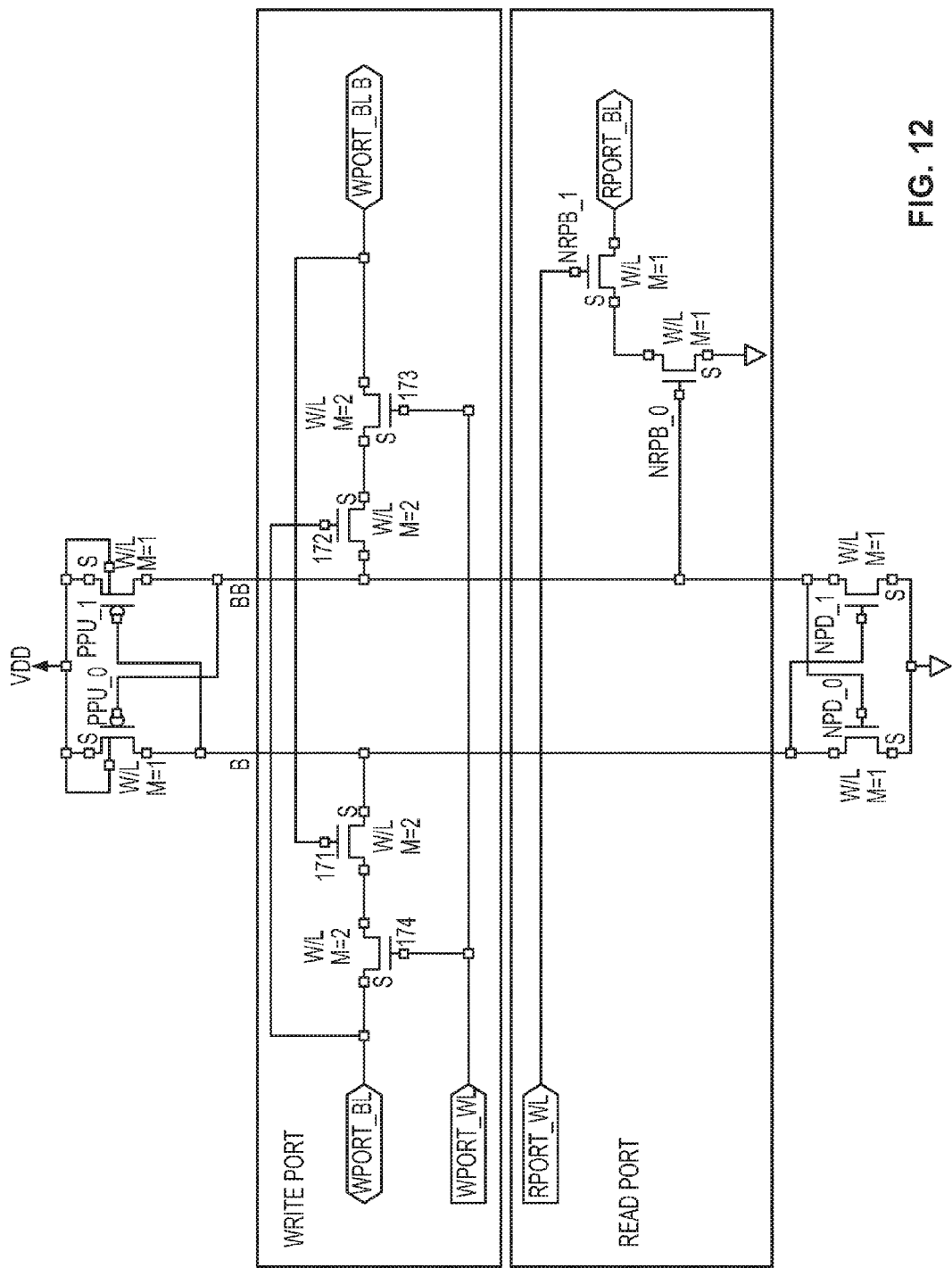

FIG. 12 provides an exemplary diagram illustrating the same memory cell in FIG. 10 but with two separate WLs used in a 2 Port, 1-read 1-write register file (RF2P) instead of a 1-port SRAM (SR1P), in accordance with various embodiments of the disclosure.

Figure 13:
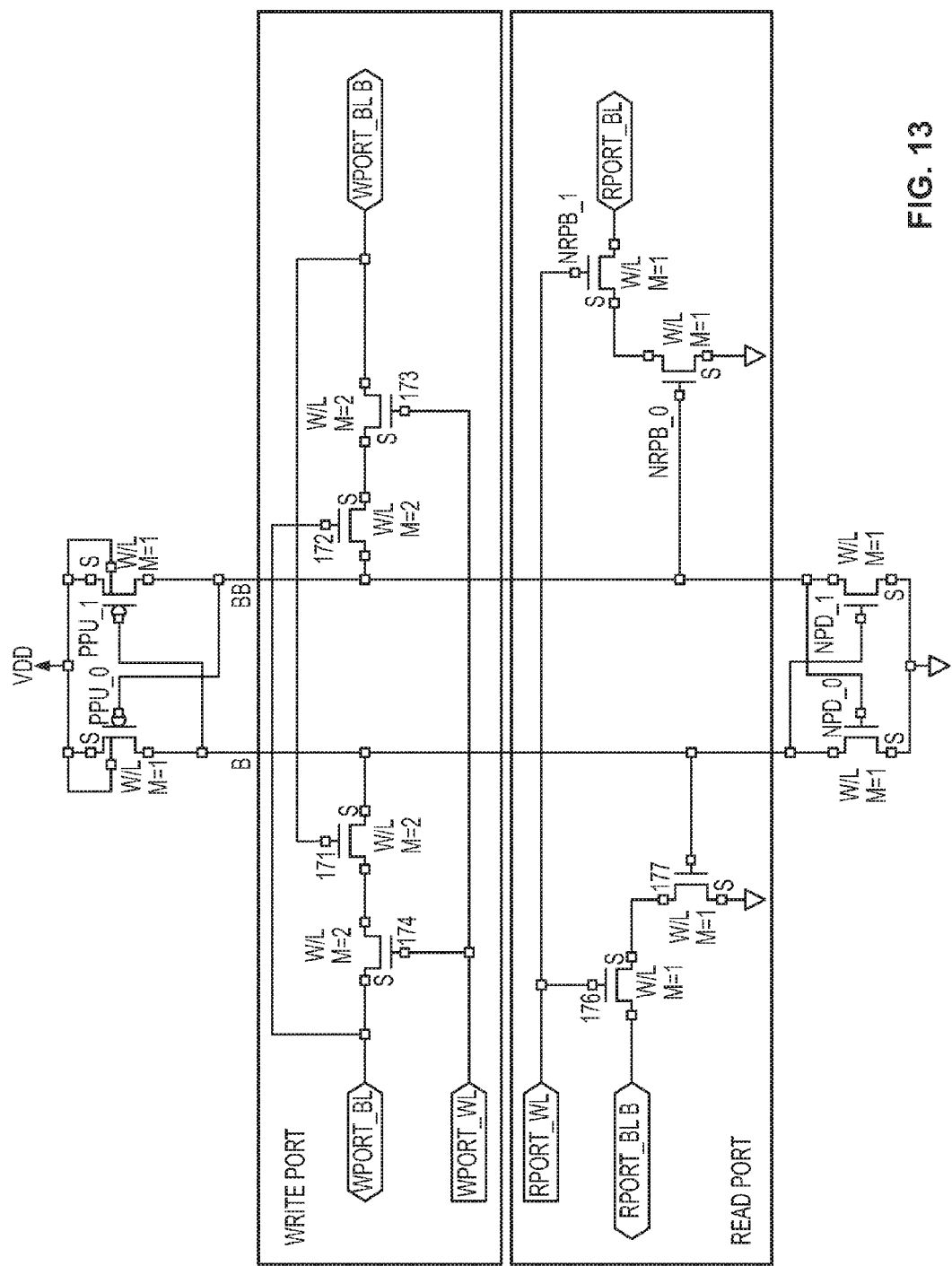

FIG. 13 provides an exemplary diagram illustrating a high performance implementation (e.g., with differential bit line sensing) of the memory cell illustrated in FIG. 12, in accordance with various embodiments of the disclosure.

Figure 14:
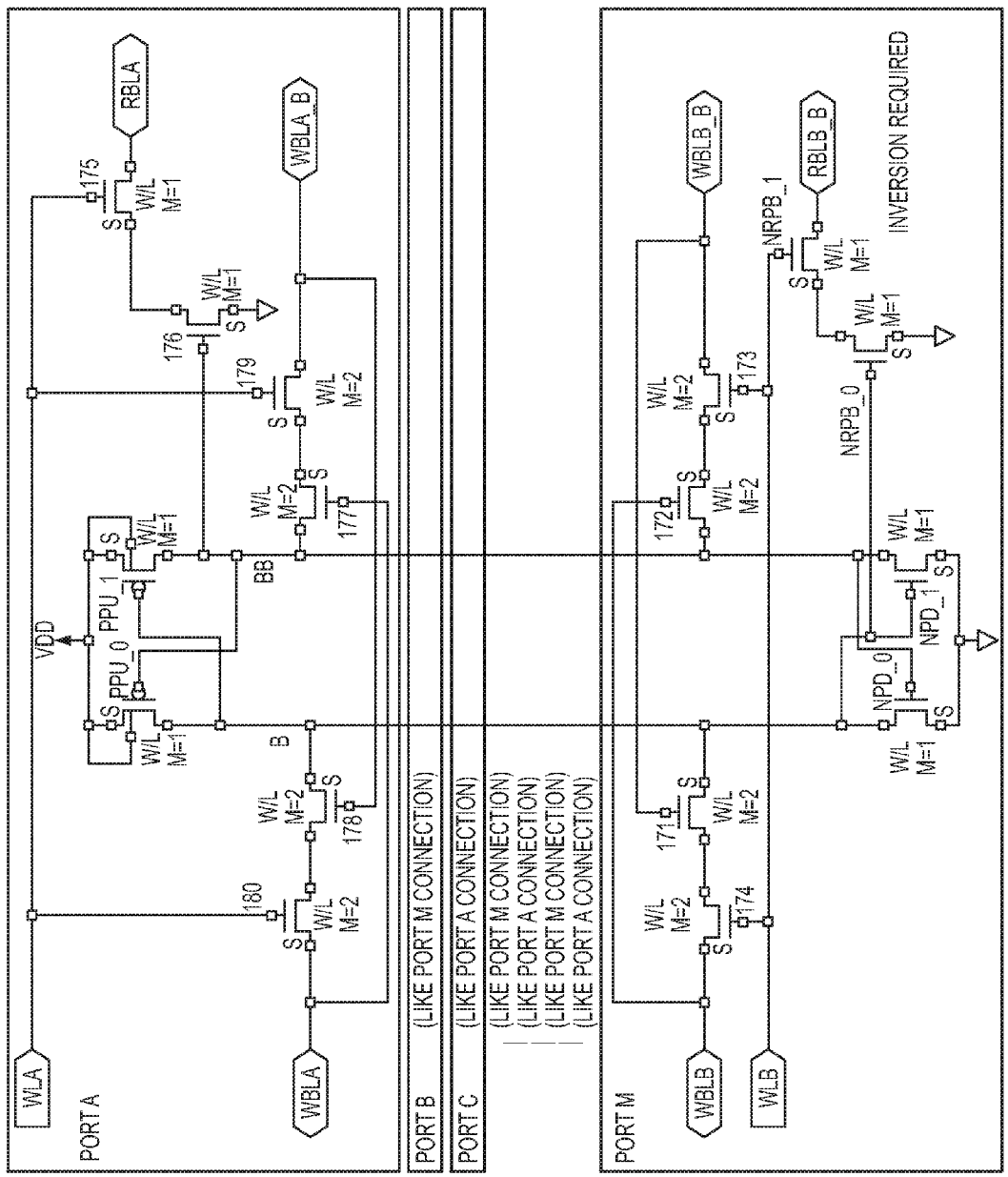
FIGS. 14-15 provide exemplary diagrams illustrating alternative implementations of a multi-port cell based on the SR2P cell illustrated in FIG. 4, in accordance with various embodiments of the disclosure.

FIG. 14 provides an exemplary diagram illustrating a multi-port cell implementation of the memory cell illustrated in FIG. 4, in accordance with various embodiments of the disclosure.

Figure 15:
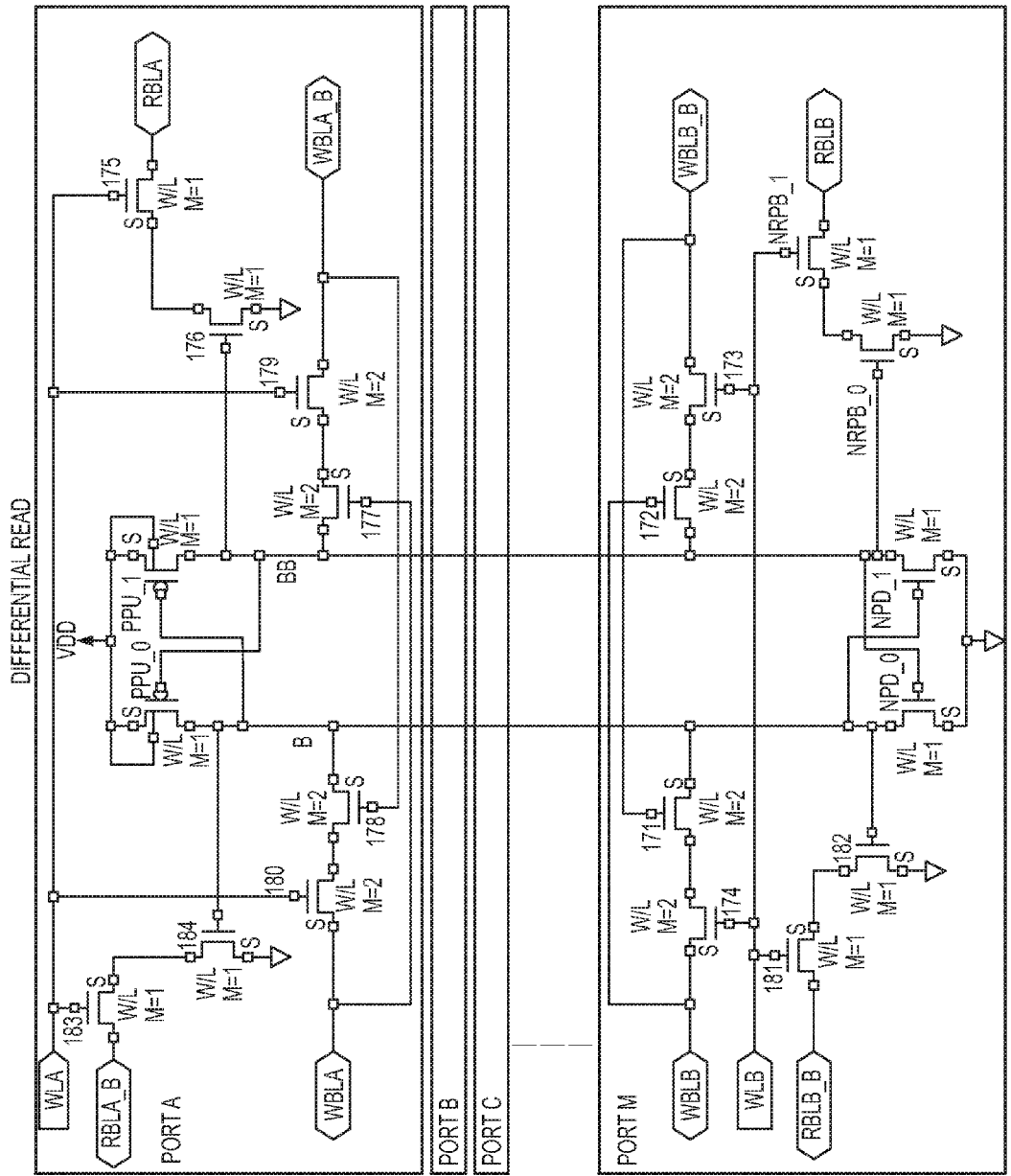

FIG. 15 provides an exemplary diagram illustrating a high performance implementation (e.g., with differential bit line sensing) of the memory cell illustrated in FIG. 14, in accordance with various embodiments of the disclosure.

Figure 16:
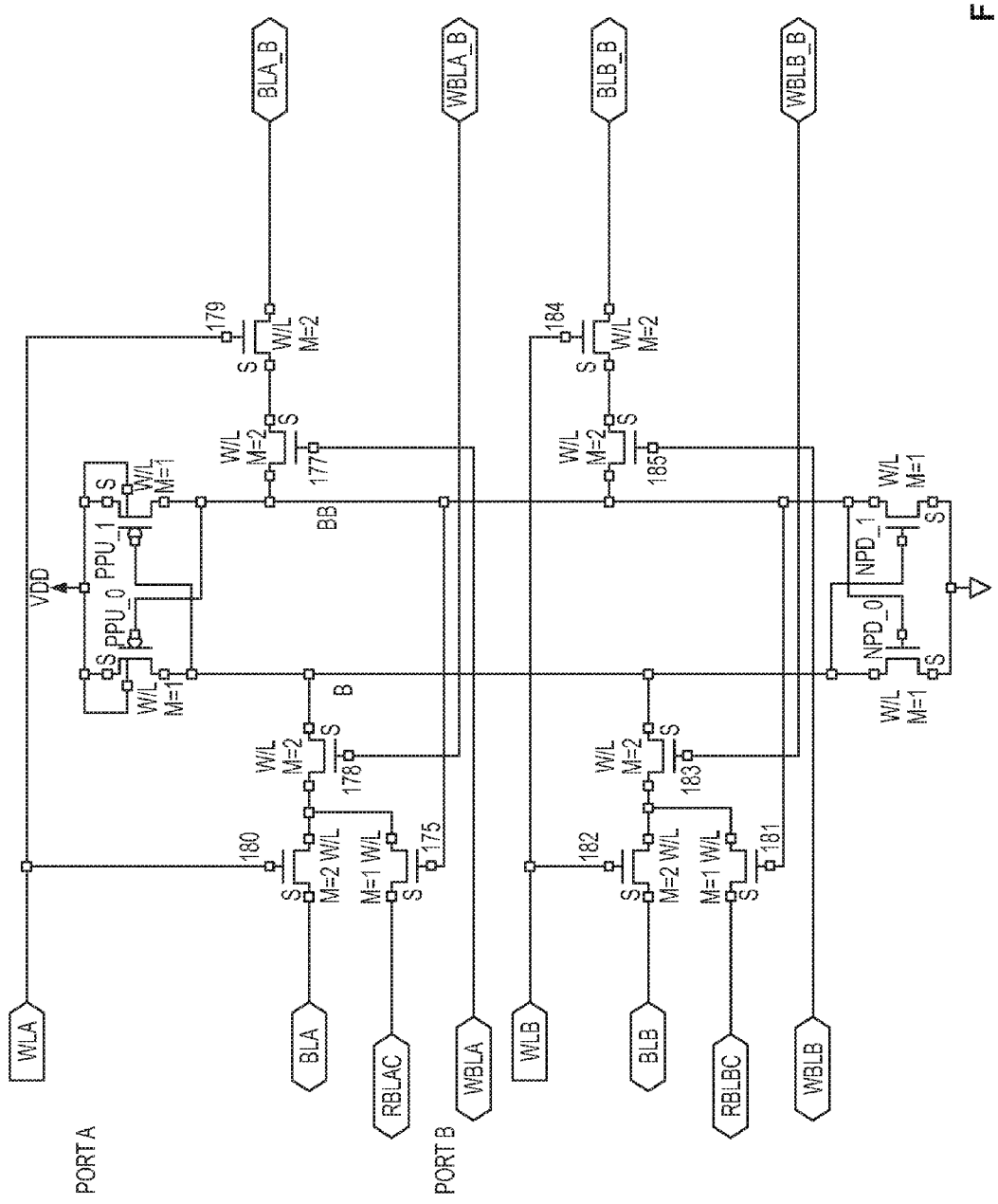
FIGS. 16-18 provides exemplary block diagrams illustrating alternative implementations of a disturb-proof dual-port cell, in accordance with various embodiments of the disclosure.

FIG. 16 provides an exemplary diagram illustrating a disturb-proof cell with less transistors but more signal lines implemented for a dual-port, in accordance with various embodiments of the disclosure.

Figure 17:
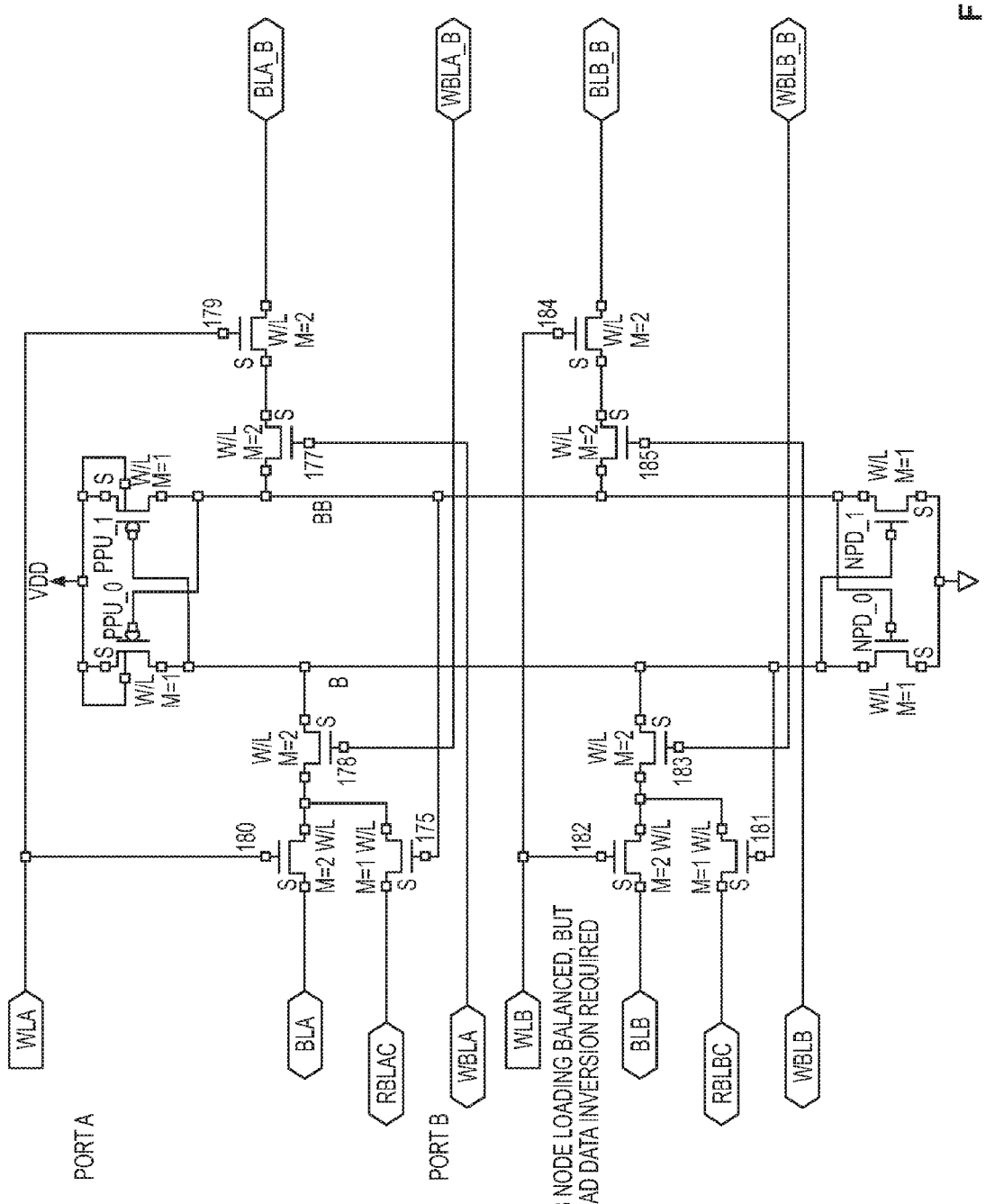

FIG. 17 provides an exemplary diagram illustrating an alternative implementation of the disturb-proof cell illustrated in FIG. 16, in accordance with various embodiments of the disclosure. For example, balanced loading of the internal nodes can be achieved, but read data inversion may be required.

Figure 18:
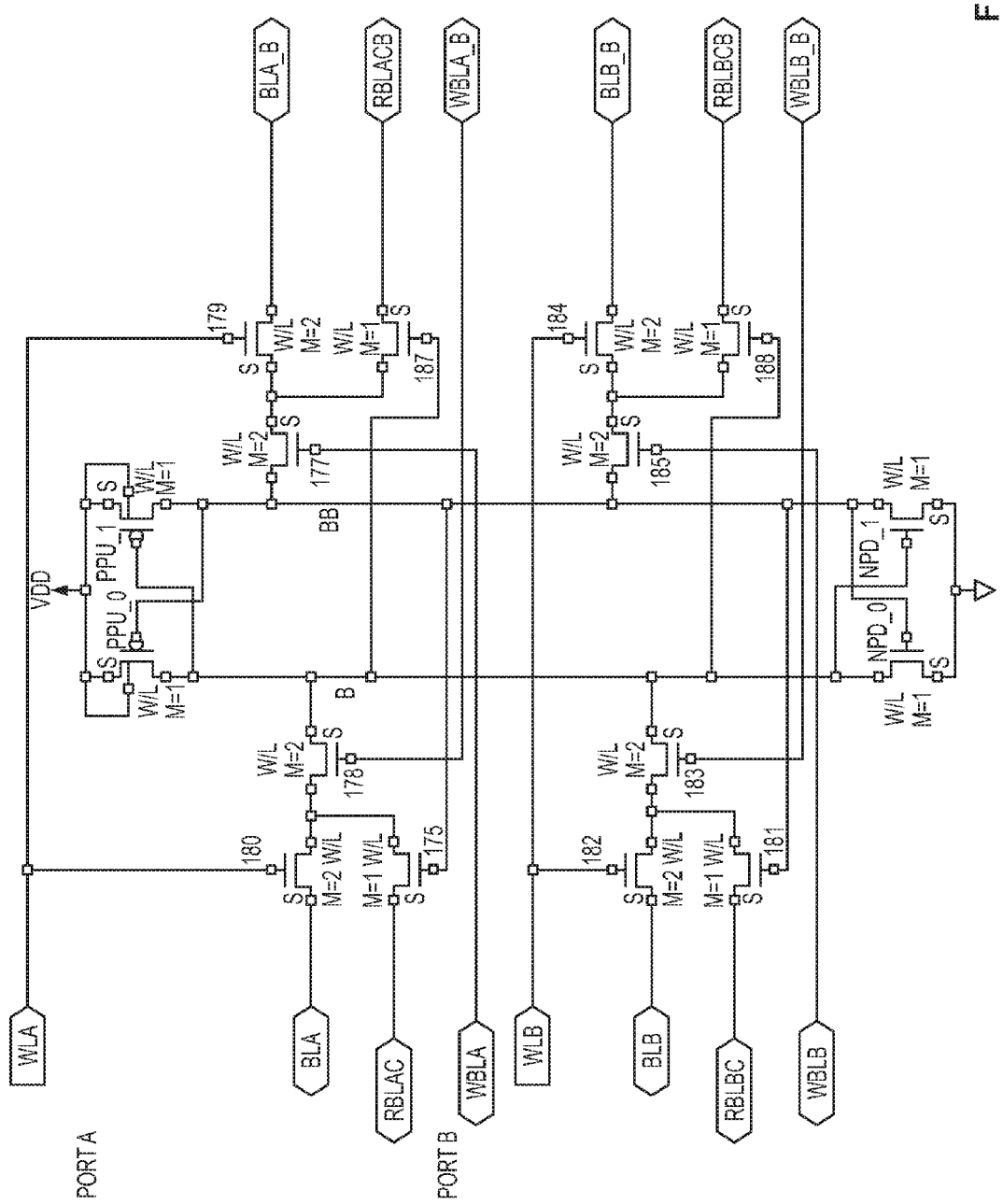

FIG. 18 provides an exemplary diagram illustrating a high performance implementation (e.g., with differential bit line sensing) of the memory cell illustrated in FIG. 16, in accordance with various embodiments of the disclosure.

Figure 19:
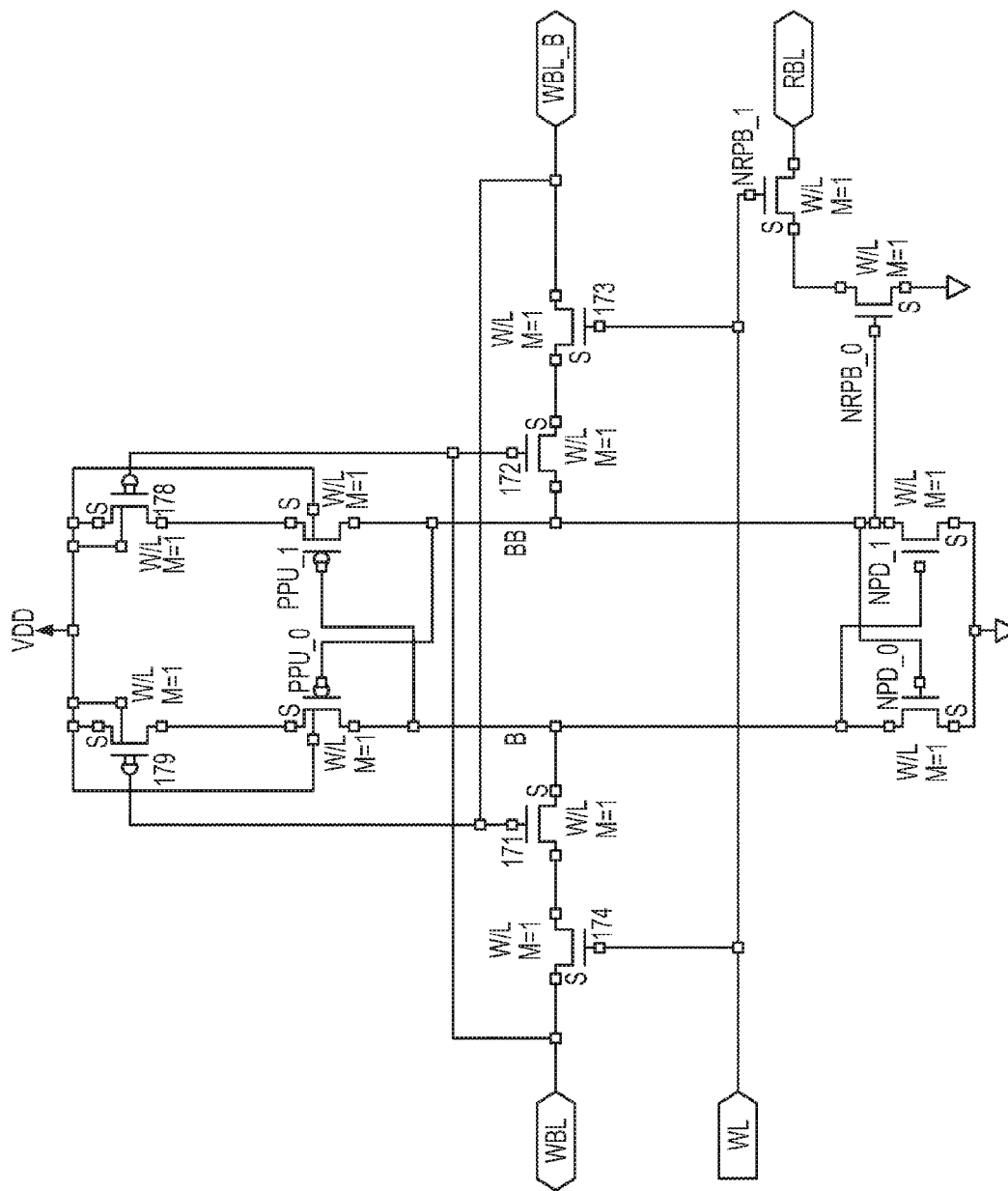
FIGS. 19-22 provide exemplary block diagrams illustrating alternative implementations of a non-fighting disturb-proof memory cell, in accordance with various embodiments of the disclosure.

FIG. 19 provides an exemplary diagram illustrating a non-fighting, disturb-proof single-port cell with only 1 WL, in accordance with various embodiments of the disclosure.

Figure 20:
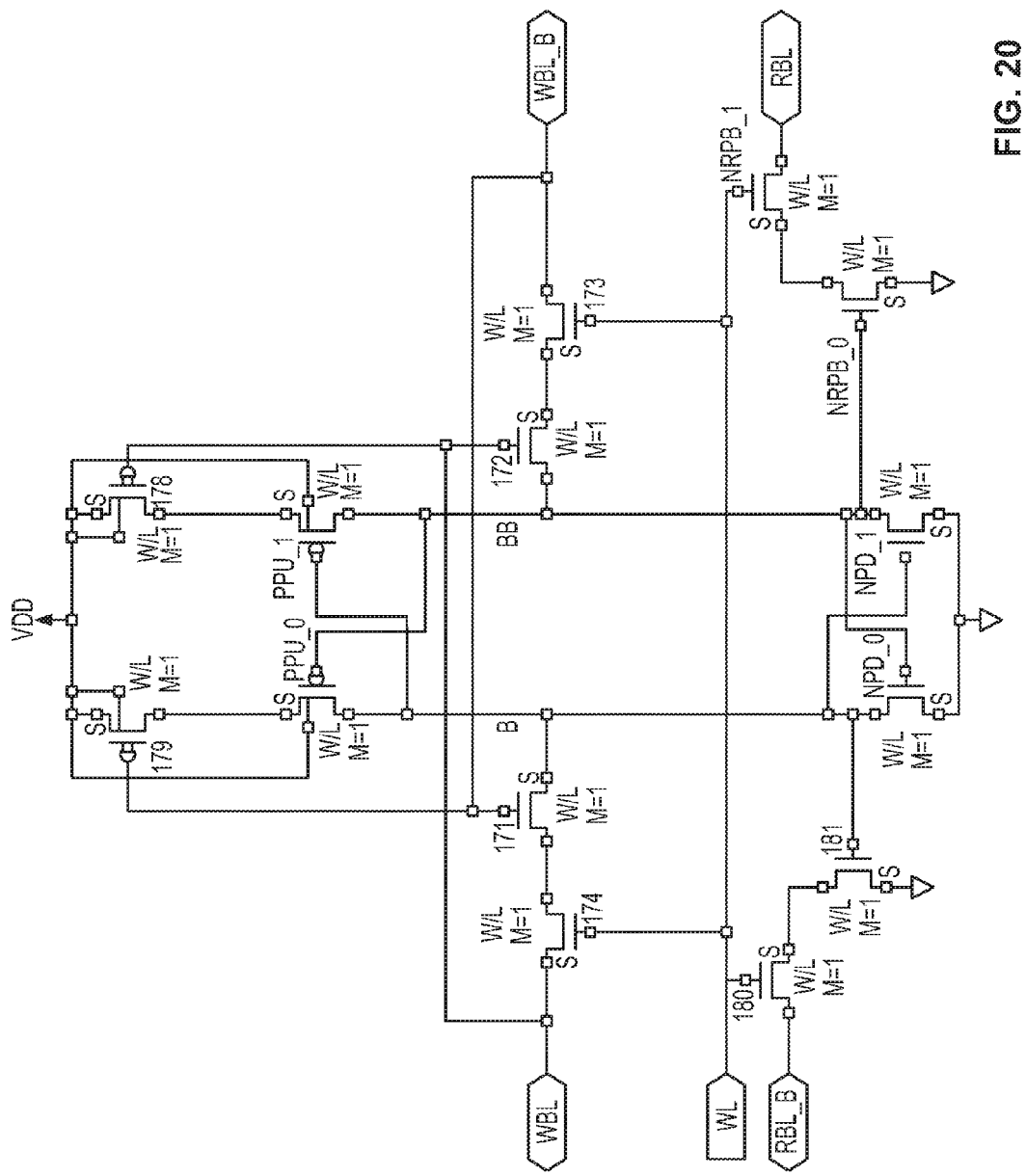

FIG. 20 provides an exemplary diagram illustrating a high performance implementation of the memory cell illustrated in FIG. 19, in accordance with various embodiments of the disclosure.

Figure 21:
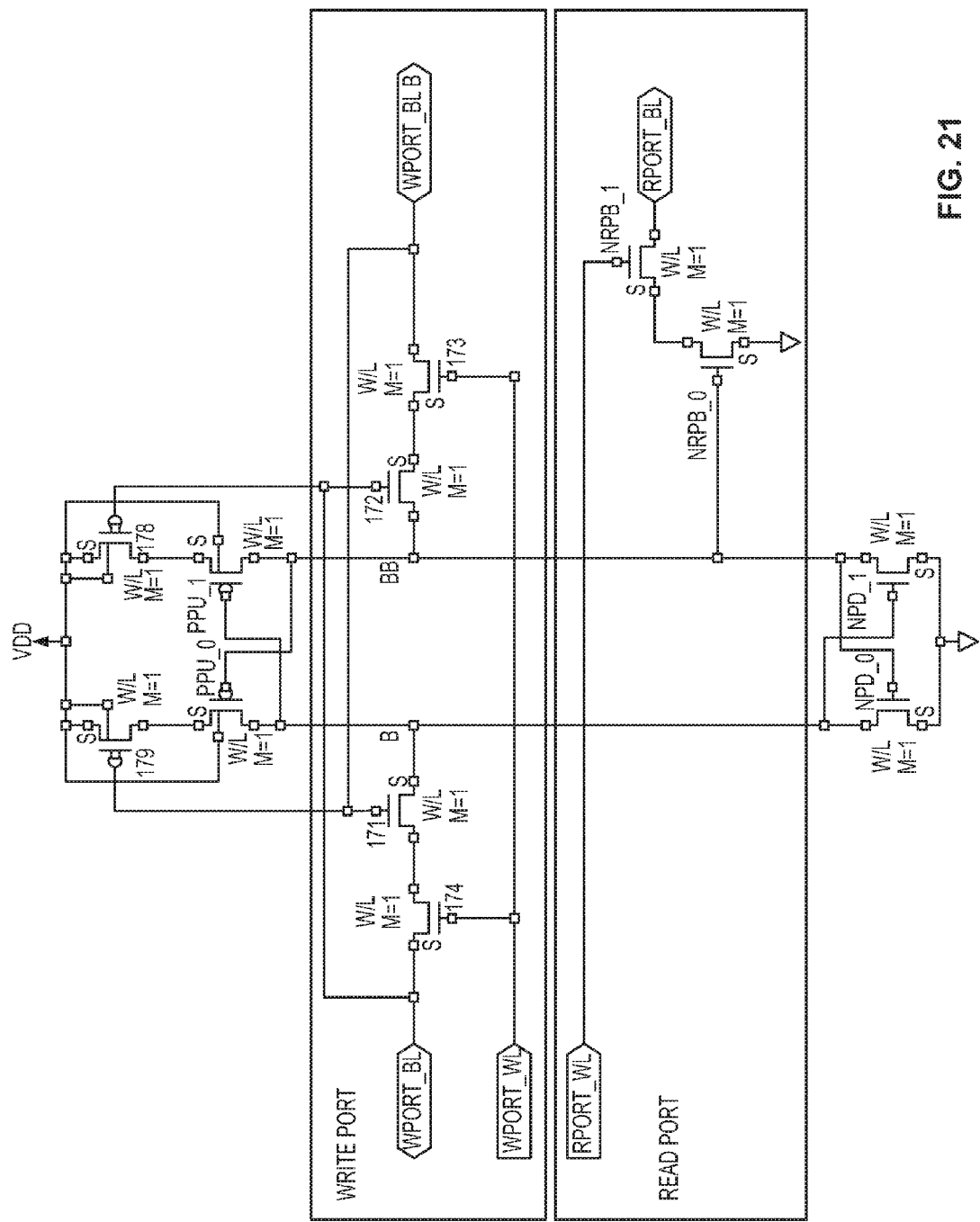

FIG. 21 provides an exemplary diagram illustrating the same memory cell illustrated in FIG. 19 with two separate WLs used in RF2P instead of SR1P, in accordance with various embodiments of the disclosure.

Figure 22:
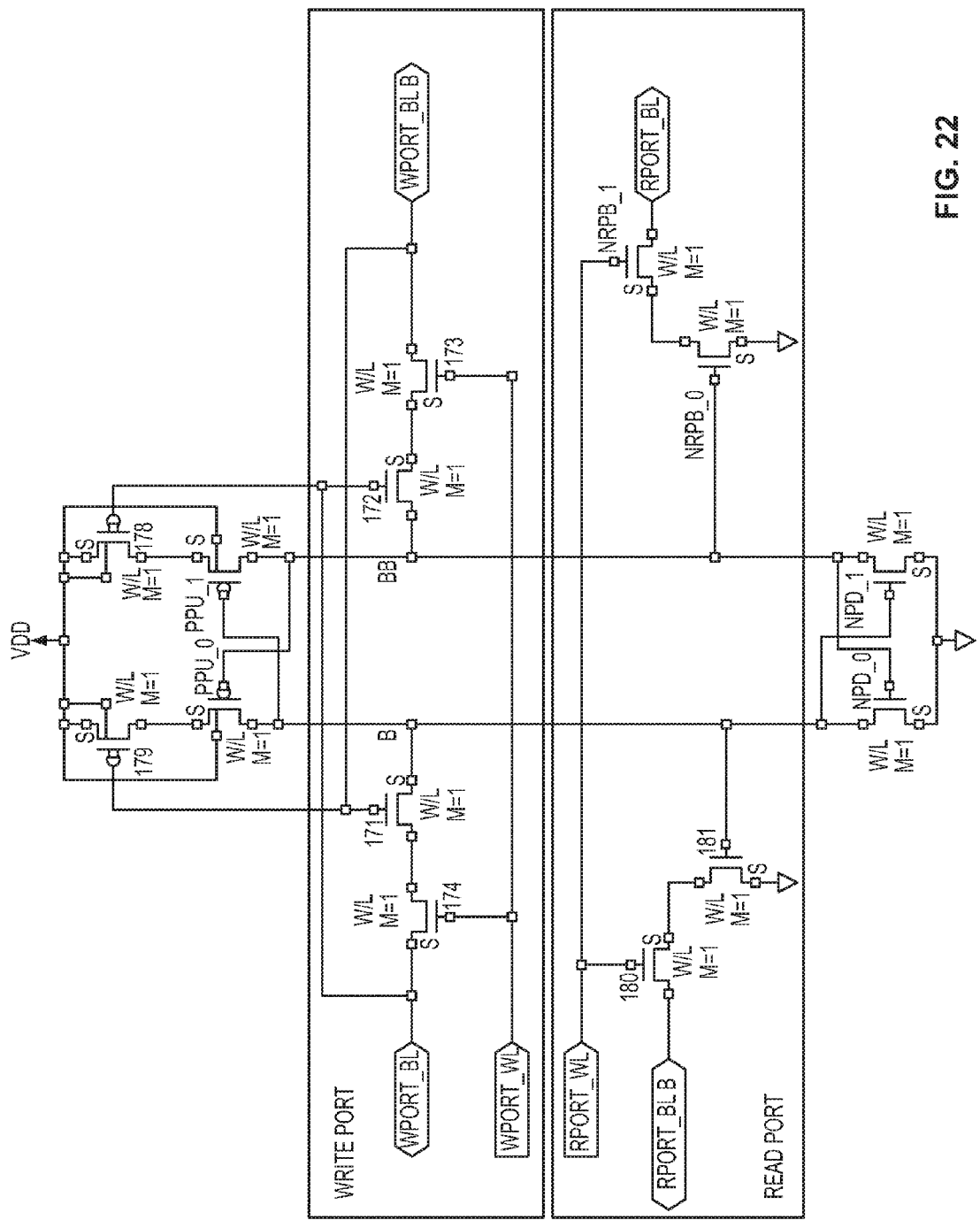

FIG. 22 provides an exemplary diagram illustrating a high performance implementation of the memory cell illustrated in FIG. 21, in accordance with various embodiments of the disclosure.

Figure 23:
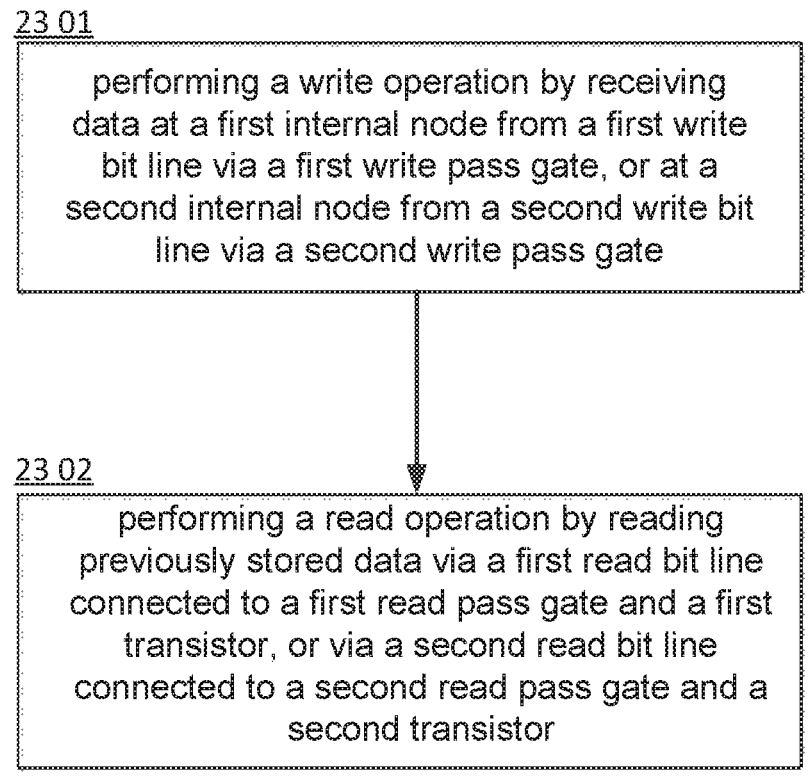
FIG. 23 provides an exemplary logic flow diagram illustrating aspects of operating the memory cell as illustrated in FIG. 3, in accordance with various embodiments of the disclosure.

FIG. 23 provides an exemplary logic flow diagram illustrating aspects of operating the memory cell as illustrated in FIG. 3, in accordance with various embodiments of the disclosure. As shown in FIG. 23, the memory cell circuit as shown in FIG. 3 may be operated for write or read operation. For example, at 2301, a write operation can be performed by receiving data at a first internal node (e.g., B 301) from a first write bit line via a first write pass gate (e.g., pass gate NMOS 305). Or the data may be received at a second internal node (e.g., BB 302) from a second write bit line via a second write pass gate (e.g., pass gate NMOS 306). At 2302, a read operation can be performed by reading previously stored data via a first read bit line (e.g., 303) connected to a first read pass gate (e.g., 313) and a first transistor. Or the previously stored data can be read out from an internal node BB 302 via a second read bit line (e.g., 304) connected to a second read pass gate (e.g., 314). The first internal node (e.g., B 301) is decoupled from the first read bit line (e.g., 313) by the first transistor, and the second internal node (e.g., 303) is decoupled from the second read bit line (e.g., 304) by the second transistor when a write operation and a read operation occur at the same time.

While various embodiments of the present disclosure have been shown and described herein, it will be obvious to those skilled in the art that such embodiments are provided by way of example only. Numerous variations, changes, and substitutions will now occur to those skilled in the art without departing from the disclosure. It should be understood that various alternatives to the embodiments of the disclosure described herein may be employed in practicing the disclosure. It is intended that the following claims define the scope of the disclosure and that methods and structures within the scope of these claims and their equivalents be covered thereby.

The foregoing is merely illustrative of the principles of this disclosure, and various modifications can be made without departing from the scope of the present disclosure. The above-described embodiments of the present disclosure are presented for purposes of illustration and not of limitation, and the present disclosure is limited only by the claims that follow.

What is claimed is:

1. A memory cell circuit, comprising:
a first write bit line and a second write bit line;
a write line;
a first internal node coupled to a first write pass gate, the first write pass gate being controlled by the second write bit line;
a second internal node coupled to a second write pass gate, the second write pass gate being controlled by the first write bit line;
a first read bit line connected to a first read pass gate and a first transistor; and
a second read bit line connected to a second read pass gate and a second transistor; wherein:
the first internal node is decoupled from the first read bit line by the first transistor, and the second internal node is decoupled from the second read bit line by the second transistor when a write operation and a read operation occur at a same time;
the first write pass gate is sequentially connected to a third write pass gate controlled by the write line, and the third write pass gate is sequentially connected to the first write bit line; and
the second write pass gate is sequentially connected to a fourth write pass gate controlled by the write line, and the fourth write pass gate is sequentially connected to the second write bit line.

2. The circuit of claim 1, further comprising:
a write word line that is configured to control the first write pass gate and the second write pass gate; and
a read word line that is configured to control the first read pass gate and the second read pass gate.

3. The circuit of claim 1, wherein the first write pass gate and the second write pass gate are turned on when a write operation occurs.

4. The circuit of claim 1, wherein the first read pass gate and the second read pass gate are turned on when a read operation occurs.

5. The circuit of claim 1, further comprising:
a first pull-down transistor connected to the first internal node; and
a second pull-down transistor connected to the second internal node, wherein:
the first pull-down transistor is stronger than the first write pass gate, and the second pull-down transistor is stronger than the second write pass gate to reduce a risk of a state of the memory cell circuit being flipped.

6. The circuit of claim 1, wherein the first write pass gate and the first read pass gate are separated to reduce a risk of content corruption between the first write pass gate and the first read pass gate when the write operation and the read operation occur at the same time.

7. The circuit of claim 1, wherein the first read bit line is associated with a first port, and the second read bit line is associated with a second port; and the memory cell circuit has a dual-port structure with no port-to-port interaction.

8. The circuit of claim 7, wherein the dual-port structure includes a differential read structure.

9. The circuit of claim 7, further comprising:
a third port that has a third read bit line.

10. The circuit of claim 1, wherein the memory cell circuit is applied in a product using a fin field effect transistor process without any write assist circuitry.

11. A method for reading or writing data to a memory cell circuit, the method comprising:
configuring a write signal for a write operation at a write line;
performing the write operation by receiving data at a first internal node from a first write bit line that is sequentially connected to a first write pass gate, the first write pass gate being controlled by a second write bit line, or at a second internal node from the second write bit line that is sequentially connected to a second write pass gate, the first write pass gate being controlled by the first write bit line, when a third write pass gate sequentially connected to the first write pass gate, or a fourth write pass gate sequentially connected to the second write pass gate, is turned on by the write line; and
performing a read operation by reading previously stored data via a first read bit line connected to a first read pass gate and a first transistor, or via a second read bit line connected to a second read pass gate and a second transistor; wherein:
the first internal node is decoupled from the first read bit line by the first transistor, and the second internal node is decoupled from the second read bit line by the second transistor when a write operation and a read operation occur at a same time.

12. The method of claim 11, further comprising:
controlling the first write pass gate and the second write pass gate via a write word line; and
controlling the first read pass gate and the second read pass gate via a read word line.

13. The method of claim 11, wherein the first write pass gate and the second write pass gate are turned on when a write operation occurs.

14. The method of claim 11, wherein the first read pass gate and the second read pass gate are turned on when a read operation occurs.

15. The method of claim 11, further comprising:
controlling a first voltage of the first internal node via a first pull-down transistor connected to the first internal node; and
controlling a second voltage of the second internal node via a second pull-down transistor connected to the second internal node, wherein:
the first pull-down transistor is stronger than the first write pass gate, and the second pull-down transistor is stronger than the second write pass gate to reduce a risk of a state of the memory cell circuit being flipped.

16. The method of claim 11, wherein the first write pass gate and the first read pass gate are separated to reduce a risk of content corruption between the first write pass gate and the first read pass gate when the write operation and the read operation occur at the same time.

17. The method of claim 11, wherein the first read bit line is associated with a first port, and the second read bit line is associated with a second port; and the memory cell circuit has a dual-port structure with no port-to-port interaction.

18. The method of claim 17, wherein the dual-port structure includes a differential read structure.

19. The method of claim 17, wherein the memory cell circuit further includes:
a third port that has a third read bit line.

20. The circuit of claim 11, further comprising:
applying the memory cell circuit in a product using a fin field effect transistor process without any write assist circuitry.

* * * * *